(12) United States Patent
Rabkin et al.

(10) Patent No.: US 11,963,352 B2
(45) Date of Patent: Apr. 16, 2024

(54) THREE-DIMENSIONAL MEMORY DEVICE WITH VERTICAL FIELD EFFECT TRANSISTORS AND METHOD OF MAKING THEREOF

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 276 days.

(21) Appl. No.: 17/362,034

(22) Filed: Jun. 29, 2021

(65) Prior Publication Data

US 2022/0068966 A1   Mar. 3, 2022

Related U.S. Application Data

(63) Continuation-in-part of application No. 17/007,761, filed on Aug. 31, 2020, now Pat. No. 11,296,113.

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02565* (2013.01); *H01L 24/08* (2013.01);
(Continued)

(58) Field of Classification Search
None
See application file for complete search history.

(56) References Cited

U.S. PATENT DOCUMENTS

| 5,915,167 A | 6/1999 | Leedy |
| 9,105,468 B2 | 8/2015 | Rabkin et al. |

(Continued)

FOREIGN PATENT DOCUMENTS

| WO | WO2017-012629 A1 | 1/2017 |
| WO | WO 2017-142619 A1 | 8/2017 |
| WO | WO 2019-182657 A1 | 9/2019 |

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Hsien Ming Lee
(74) *Attorney, Agent, or Firm* — THE MARBURY LAW GROUP PLLC

(57) ABSTRACT

A semiconductor structure includes at least one set of vertical field effect transistors embedded within dielectric material layers overlying a substrate. Each vertical field effect transistor includes a bottom electrode, a metal oxide semiconductor vertical transistor channel, a cylindrical gate dielectric, and a top electrode. A three-dimensional NAND memory array can be provided over the first field effect transistors, and can be electrically connected to the vertical field effect transistors via metal interconnect structures. Alternatively, a three-dimensional NAND memory array can be formed on another substrate, which can be bonded to the substrate via metal-to-metal bonding. The vertical field effect transistors can be employed as switches for bit lines, word lines, or other components of the three-dimensional NAND memory array.

20 Claims, 40 Drawing Sheets

(51) Int. Cl.
- H01L 23/00 (2006.01)
- H01L 25/00 (2006.01)
- H01L 25/065 (2023.01)
- H01L 25/18 (2023.01)
- H01L 29/24 (2006.01)
- H10B 41/27 (2023.01)

(52) U.S. Cl.
CPC .......... *H01L 24/80* (2013.01); *H01L 25/0657* (2013.01); *H01L 25/18* (2013.01); *H01L 25/50* (2013.01); *H01L 29/24* (2013.01); *H10B 41/27* (2023.02); *H01L 2224/08145* (2013.01); *H01L 2224/80895* (2013.01); *H01L 2224/80896* (2013.01); *H01L 2924/1067* (2013.01); *H01L 2924/1431* (2013.01); *H01L 2924/14511* (2013.01)

(56) References Cited

U.S. PATENT DOCUMENTS

| | | | |
|---|---|---|---|
| 9,240,420 | B2 | 1/2016 | Rabkin et al. |
| 9,443,907 | B2 | 9/2016 | Rabkin et al. |
| 9,530,790 | B1 | 12/2016 | Lu et al. |
| 9,595,535 | B1 | 3/2017 | Ogawa et al. |
| 9,634,097 | B2 | 4/2017 | Rabkin et al. |
| 9,876,031 | B1 | 1/2018 | Shimizu et al. |
| 10,032,908 | B1 | 7/2018 | Ratnam et al. |
| 10,079,267 | B1 | 9/2018 | Yeh et al. |
| 10,083,877 | B1 | 9/2018 | Sano et al. |
| 10,115,895 | B1 | 10/2018 | Takaki et al. |
| 10,256,272 | B2 | 4/2019 | Yoshida et al. |
| 10,283,493 | B1 | 5/2019 | Nishida |
| 10,290,681 | B2 | 5/2019 | Yeh et al. |
| 10,319,635 | B2 | 6/2019 | Nosho et al. |
| 10,381,409 | B1 | 8/2019 | Zhou et al. |
| 10,381,559 | B1 | 8/2019 | Zhou et al. |
| 10,453,798 | B2 | 10/2019 | Tsutsumi et al. |
| 10,510,738 | B2 | 12/2019 | Kim et al. |
| 2002/0028541 | A1 | 3/2002 | Lee et al. |
| 2013/0336037 | A1 | 12/2013 | Chen et al. |
| 2014/0252454 | A1 | 9/2014 | Rabkin et al. |
| 2015/0009757 | A1 | 1/2015 | Hu et al. |
| 2015/0055414 | A1 | 2/2015 | Chen |
| 2015/0069320 | A1 | 3/2015 | Rabkin et al. |
| 2015/0370947 | A1 | 12/2015 | Moroz et al. |
| 2016/0149004 | A1 | 5/2016 | Rabkin et al. |
| 2017/0040381 | A1 | 2/2017 | Chen et al. |
| 2017/0148517 | A1 | 5/2017 | Harari |
| 2018/0197988 | A1 | 7/2018 | Ratnam et al. |
| 2018/0342455 | A1 | 11/2018 | Nosho et al. |
| 2018/0366487 | A1 | 12/2018 | Okizumi et al. |
| 2018/0374899 | A1 | 12/2018 | Yoshida et al. |
| 2019/0051703 | A1 | 2/2019 | Sel et al. |
| 2019/0088717 | A1 | 3/2019 | Yeh et al. |
| 2019/0096808 | A1 | 3/2019 | Tsutsumi et al. |
| 2019/0103467 | A1 | 4/2019 | Takaki et al. |
| 2019/0221557 | A1 | 7/2019 | Kim et al. |
| 2020/0098875 | A1 | 3/2020 | Sung et al. |
| 2020/0098880 | A1 | 3/2020 | Sharma et al. |
| 2020/0098930 | A1 | 3/2020 | Le et al. |
| 2020/0098931 | A1 | 3/2020 | Sharma et al. |
| 2020/0105712 | A1 | 4/2020 | Hsieh et al. |
| 2020/0105721 | A1 | 4/2020 | Park |
| 2020/0105892 | A1 | 4/2020 | Haratipour et al. |
| 2021/0028282 | A1 | 1/2021 | Kumar et al. |
| 2021/0104632 | A1 | 4/2021 | Jeong et al. |
| 2021/0135010 | A1 | 5/2021 | Yamazaki et al. |
| 2021/0202458 | A1* | 7/2021 | Jung .................. H10B 43/27 |

OTHER PUBLICATIONS

USPTO Office Communication, Ex Parte Quayle for U.S. Appl. No. 17/007,761, mailed Sep. 30, 2021, 14 pages.

U.S. Appl. No. 17/007,761, filed Aug. 28, 2020, SanDisk Technologies LLC.

U.S. Appl. No. 17/007,823, filed Aug. 31, 2020, SanDisk Technologies LLC.

USPTO Office Communication, Ex Parte Quayle, for U.S. Appl. No. 17/007,761, mailed on Sep. 30, 2021, 14 pages.

Kaneko, K. et al., "Highly reliable BEOL-transistor with oxygen-controlled InGaZnO and Gate/Drain offset design for high/low voltage bridging I/O operations," 2011 International Electron Devices Meeting, 2011, p. 7.4.1-7.4.4, (2011); Doi: 10.1109/IEDM.2011.6131507.

Kaneko, K. et al., "A Novel BEOL Transistor (BETr) with InGaZnO Embedded in Cu-Interconnects for On-chip High Voltage I/Os in Standard CMOS LSIs," 2011 Symposium on VLSI Technology Digest of Technical Papers, pp. 120-121, (2011).

Kaneko, K. et al., "Operation of Functional Circuit Elements using BEOL-Transistor with InGaZnO Channel for On-chip High/Low Voltage Bridging I/Os and High-Current Switches," 2012 Symposium on VLSI Technology Digest of Technical Papers, pp. 123-124, (2012).

Park, J. C. et al., "High performance amorphous oxide thin film transistors with self-aligned top-gate structure," 2009 EEE International Electron Devices Meeting (IEDM), 2009, pp. 1-4, (2009) Doi: 10.1109/IEDM.2009.5424391.

Sheng, J. et al., "Amorphous IGZO TFT with High Mobility of ~70 cm2/(V s) via Vertical Dimension Control Using PEALD," ACS Appl. Mater. Interfaces 2019, vol. 11, No. 43, pp. 40300-40309, (2019); Doi.org/10.1021/acsami.9b14310.

Yamazaki, S., "A Possibility of Crystalline Indium-Gallium-Zinc-Oxide," asQED symposium 2013 (5th Asia Symposium on Quality Electronic Design ), Slide show, 42 pages, (2013).

Notification of Transmittal of the International Search Report and the Written Opinion of the International Searching Authority for International Patent Application No. PCT/US2021/036187, dated Oct. 28, 2021, 11 pages.

USPTO Office Communication, Non-Final Office Action for U.S. Appl. No. 17/007,823, dated Jun. 13, 2022, 28 pages.

* cited by examiner

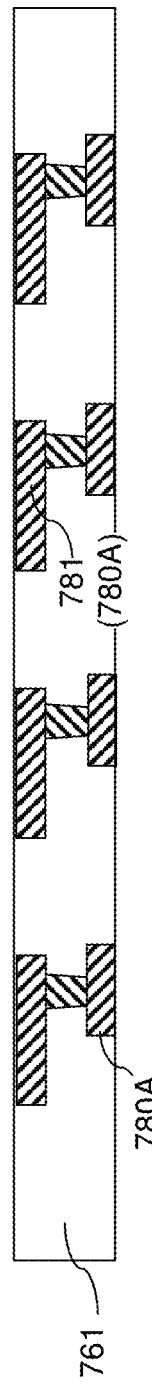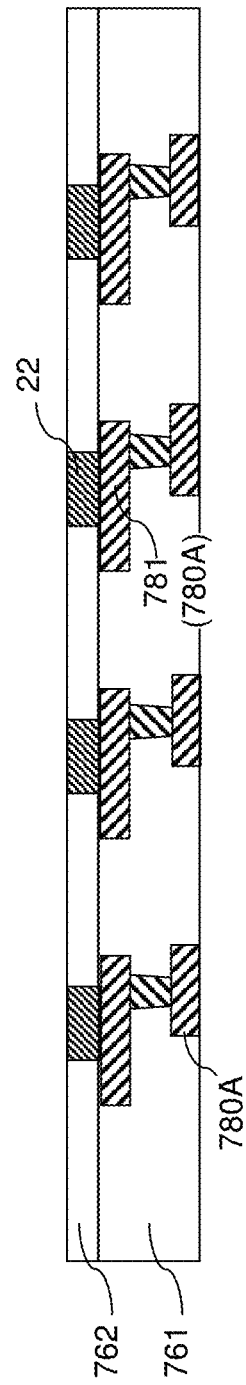

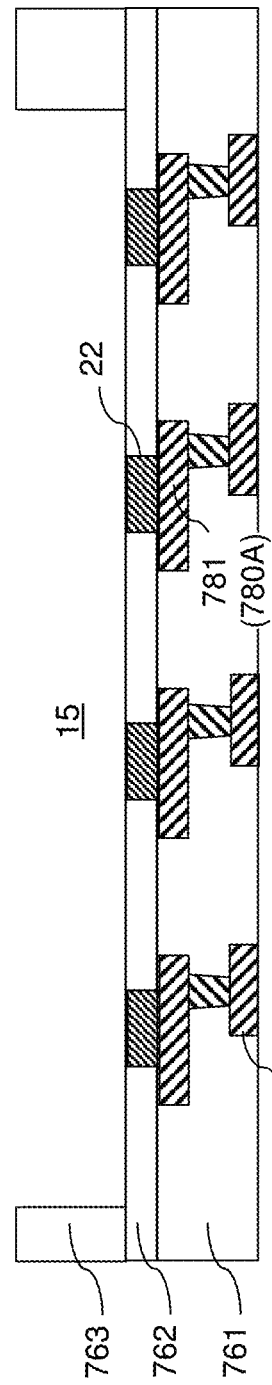
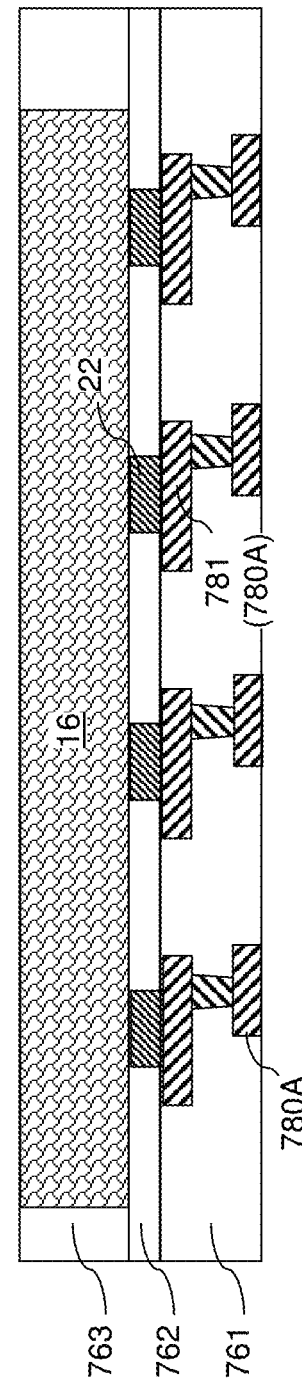

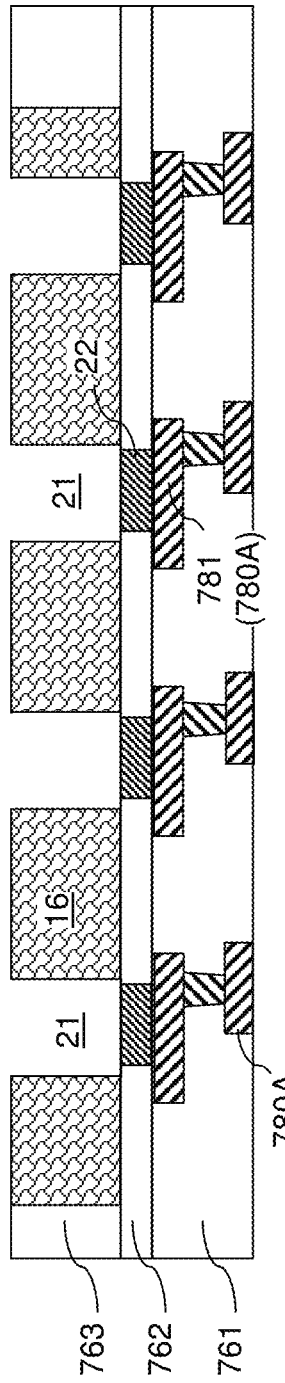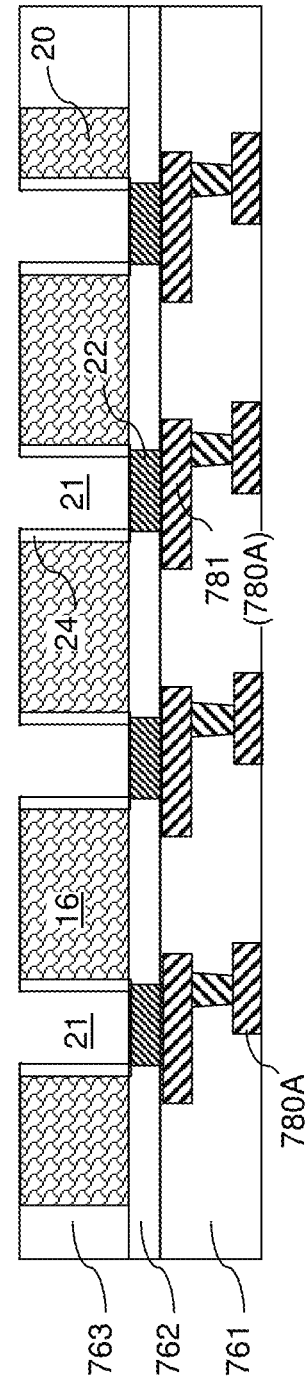

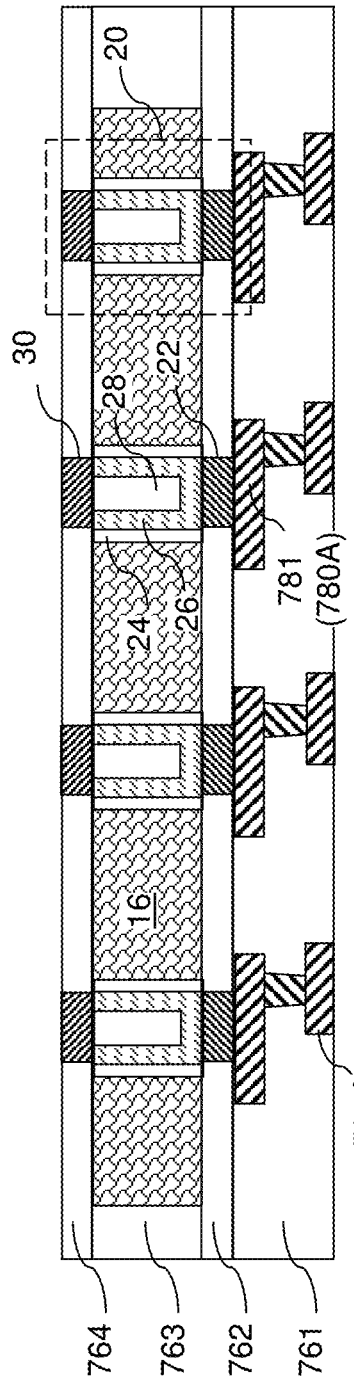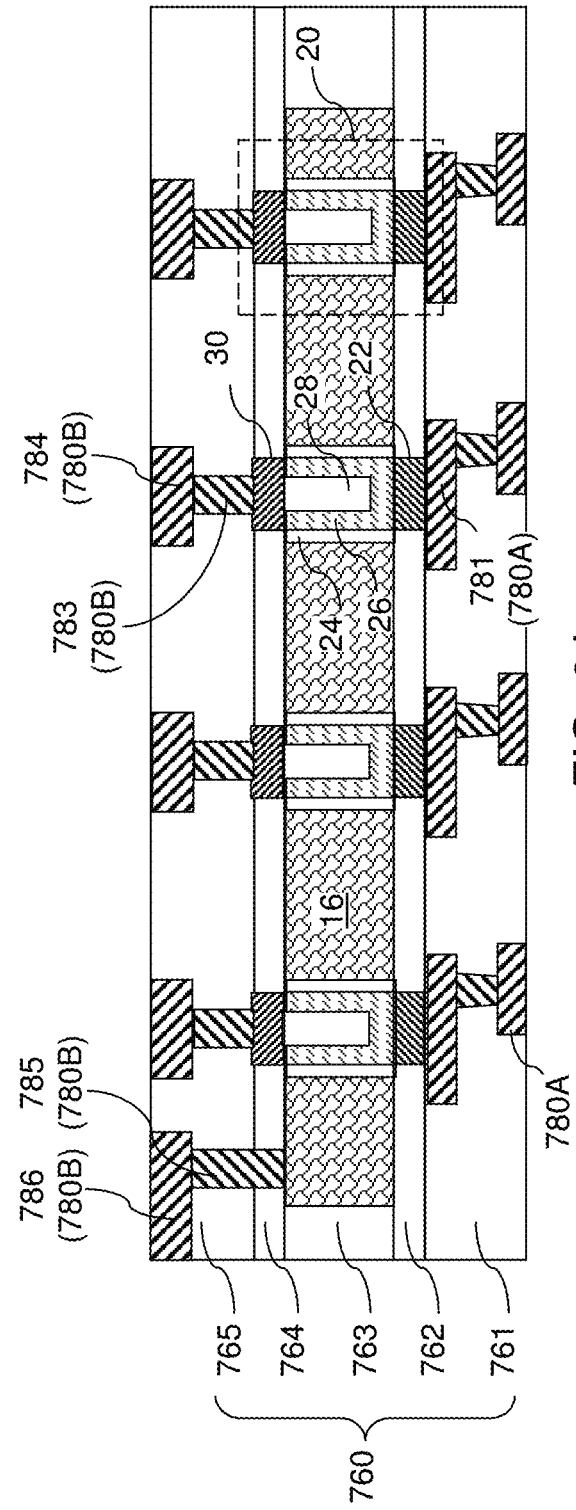
FIG. 6I
FIG. 6J

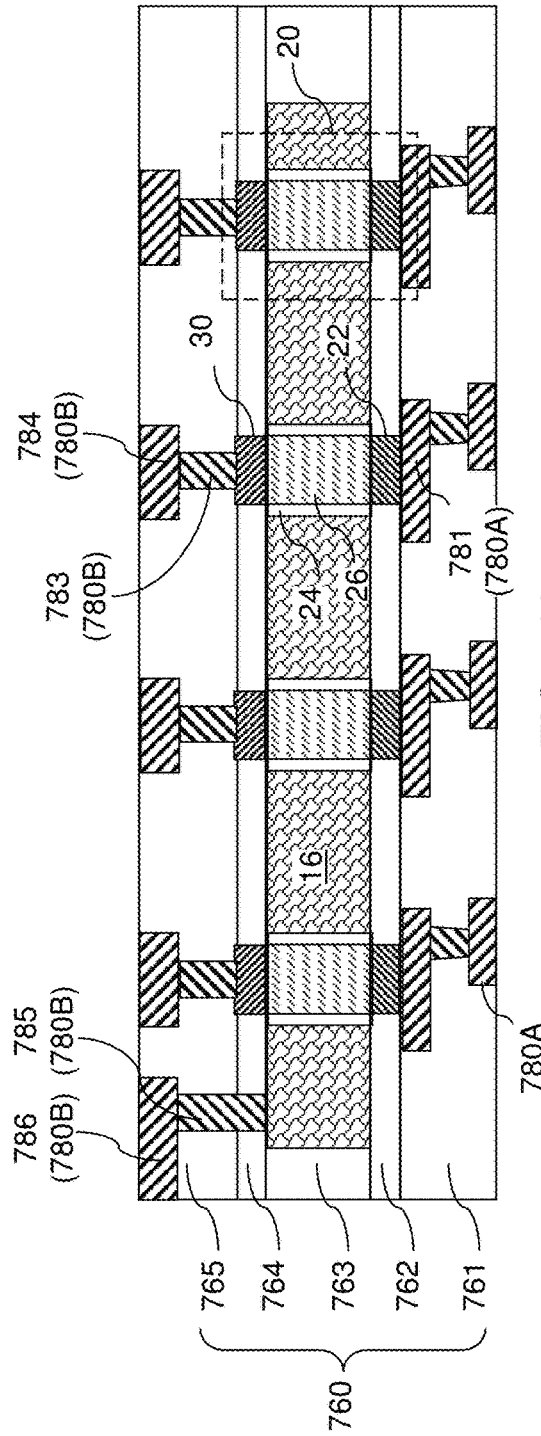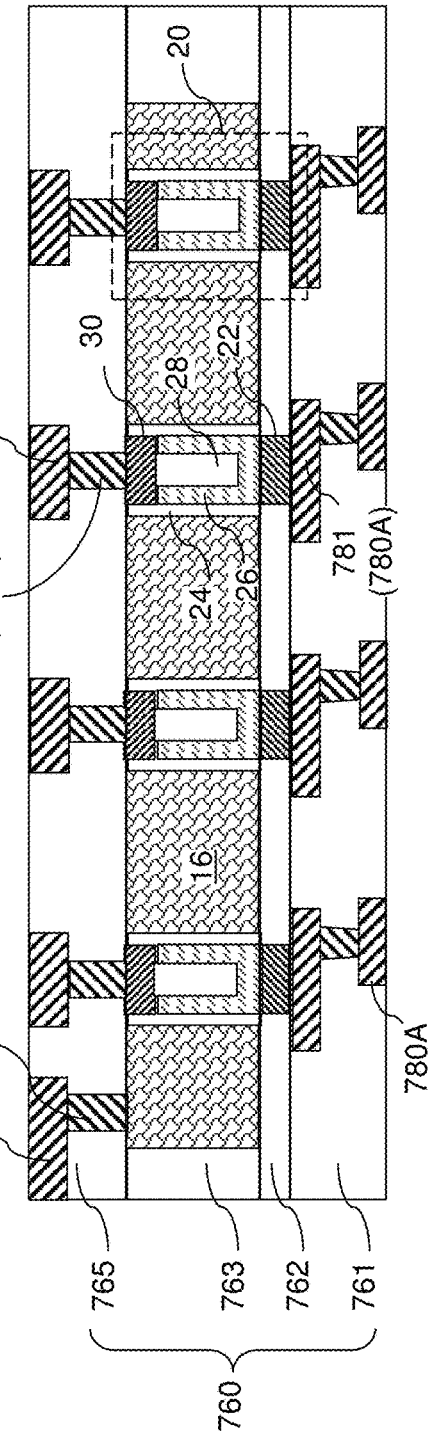

THREE-DIMENSIONAL MEMORY DEVICE WITH VERTICAL FIELD EFFECT TRANSISTORS AND METHOD OF MAKING THEREOF

FIELD

The present disclosure relates generally to the field of semiconductor devices, and particular to a three-dimensional memory device containing vertical field effect transistors and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: at least one set of vertical field effect transistors, wherein each vertical field effect transistor within each set of vertical field effect transistors comprises a bottom electrode, a vertical transistor channel, a gate dielectric which surrounds the vertical transistor channel, and a top electrode; and a three-dimensional NAND memory array located over the at least one set of vertical field effect transistors, wherein electrical nodes of the three-dimensional NAND memory array are electrically connected to a respective one of the at least one set of vertical field effect transistors.

BRIEF DESCRIPTION OF THE DRAWINGS

FIGS. 6A-6J are sequential vertical cross-sectional views of a region of the exemplary logic die during formation of a set of vertical field effect transistors according to an embodiment of the present disclosure.

FIGS. 6K-6N are vertical cross-sectional views of alternative configurations of a region of the exemplary logic die according to embodiments of the present disclosure.

DETAILED DESCRIPTION

Figure 1A:
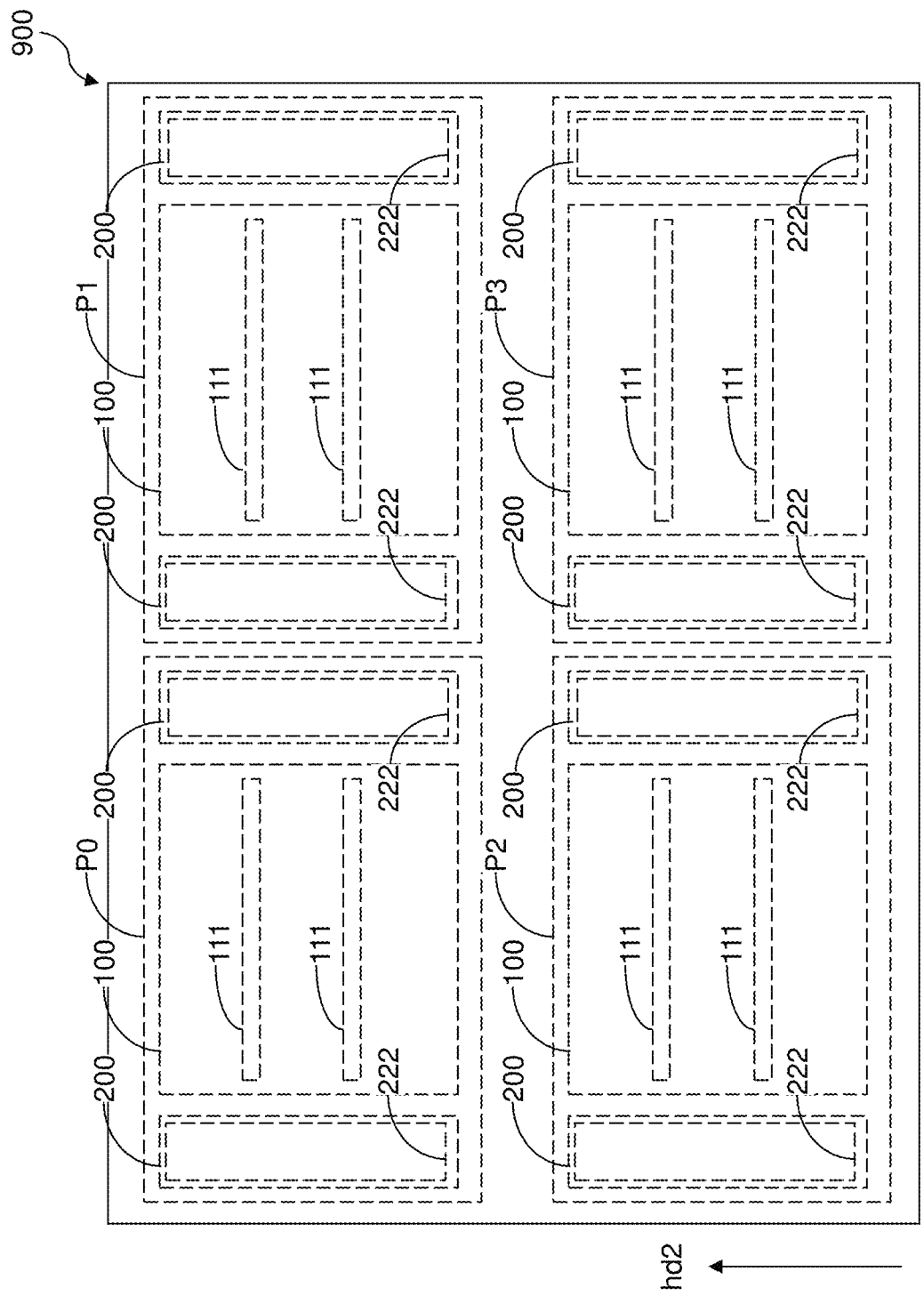
FIG. 1A is a plan view of an exemplary memory die according to a first embodiment of the present disclosure.

As discussed above, the present disclosure is directed to a three-dimensional memory device containing a logic (e.g., driver) circuit containing vertical field effect transistors and methods of manufacturing the same, the various aspects of which are described below. The vertical field effect transistors occupy less space over the substrate than lateral (i.e., horizontal) field effect transistor. This provides a more compact logic circuit. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Wherever physical contact between two elements is illustrated in the drawings, direct physical contact between the two elements is provided. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow. As used herein, a first element is electrically connected to a second element if there exists an electrically conductive path between the first element and the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The various three-dimensional memory devices of the present disclosure include a monolithic three-dimensional NAND string memory device, and can be fabricated employing the various embodiments described herein.

Generally, a semiconductor die, or a semiconductor package, can include be a single memory chip. Each semiconductor package contains one or more dies (for example one, two, or four). The die is the smallest unit that can independently execute commands or report status. Each die contains one or more planes (typically between 1 and 8). Identical, concurrent operations can take place on each plane, although with some restrictions. Each plane contains a number of blocks (i.e., memory blocks), which are the smallest unit that can be erased by in a single erase operation. Each block contains a number of pages, which are the smallest unit that can be programmed, i.e., a smallest unit on which a read operation can be performed.

Referring to FIG. 1A, a plan view of an exemplary memory die 900 according to a first embodiment of the present disclosure is illustrated. The memory die 900 includes at least one memory plane, such as two to four planes (P0-P3), each of which can concurrently execute identical operations. Multiple alternating stacks of insulating layers and electrically conductive layers can be provided within each plane (P0-P3). Each plane (P0-P3) can include a three-dimensional memory array that includes a respective three-dimensional array of memory elements. Each alternating stack can laterally extend along a first horizontal direction (e.g., word line direction) hd1, and can be laterally spaced apart along a second horizontal direction (e.g., bit line direction) hd2. Each plane (P0-P3) can include a respective memory array region 100 and at least one staircase region 200 in which stepped surfaces of alternating stacks of insulating layers and electrically conductive layers are provided to enable formation of layer contact via structures. The memory array region 100 of each plane (P0-P3) includes memory openings and memory opening fill structures. Each memory opening fill structure can include a memory stack structure, which contains a vertical semiconductor channel and a vertical stack of memory elements. A three-dimensional array of memory elements is provided within portions of the memory stack structure located within a memory array region. The electrically conductive layers of each alternating stack functions as word lines for the vertical stack of memory elements.

Electrical contacts to the electrically conductive layers (e.g., word lines and select lines) are provided with memory-side word-line hookup regions 222, which overlaps with the staircase regions in which the alternating stacks have stepped surfaces. The memory-side word-line hookup regions 222 can include memory-side bonding pads that are electrically connected to the electrically conductive layers. A bottom end of each vertical semiconductor channel can be adjoined to a horizontal semiconductor channel or a source region located within a semiconductor (e.g., silicon) material layer, which may be a memory-die substrate semiconductor layer. A top end of each vertical semiconductor channel is adjoined to a drain region, which can be located at a topmost portion of a respective memory opening fill structure. Bit lines laterally extending along the second horizontal direction hd2 can be provided over the drain regions, and can be electrically connected to a respective subset of the drain regions via drain contact via structures. Connection between the bit line and overlying metal interconnect structures can be formed in memory-side bit-line hookup regions 111, which can laterally extend along the first horizontal direction hd1 and can be located between alternating stacks of insulating layers and electrically conductive layers. The memory-side bit-line hookup regions 111 can include memory-side bonding pads that are electrically connected to the bit lines. While two memory-side bit-line hookup regions 111 are illustrated in FIG. 1A, the number of the bit-line hookup regions may be increased as needed.

Figure 1B:
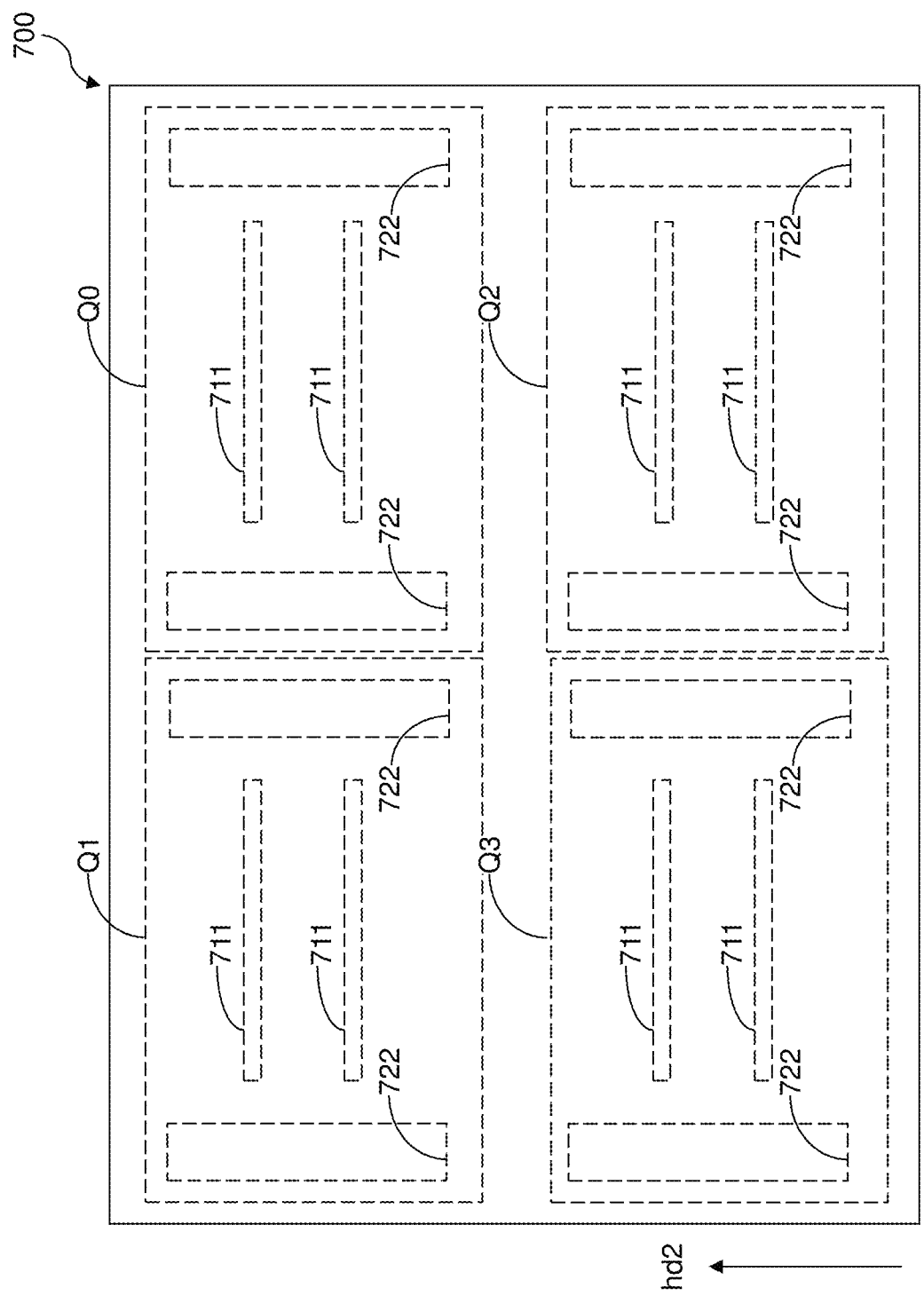
FIG. 1B is a plan view of an exemplary logic die according to the first embodiment of the present disclosure.
Figure 2A:
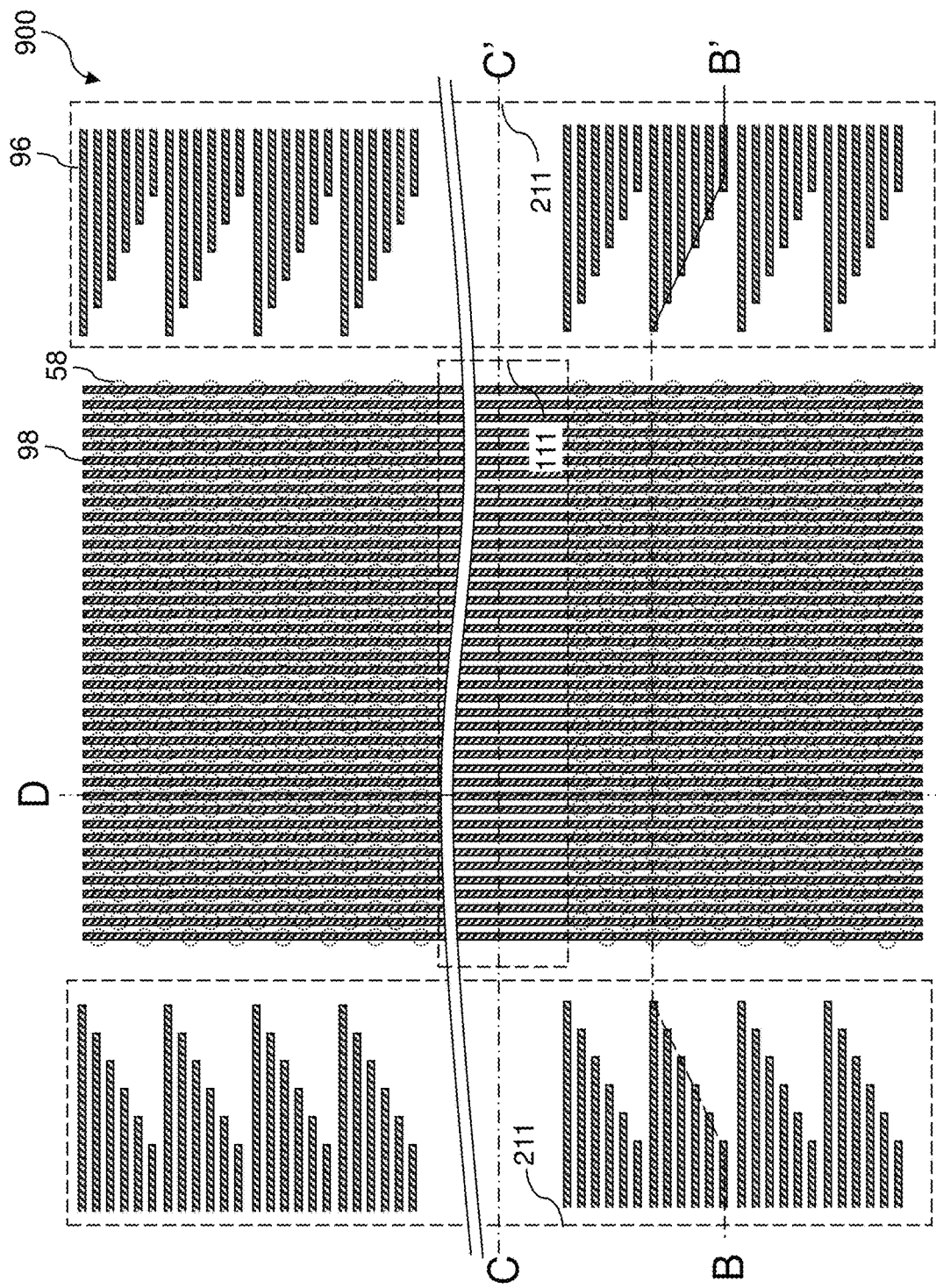
FIG. 2A is a horizontal cross-sectional view of a region of the exemplary memory die of FIG. 1A according to the first embodiment of the present disclosure.
Figure 2B:
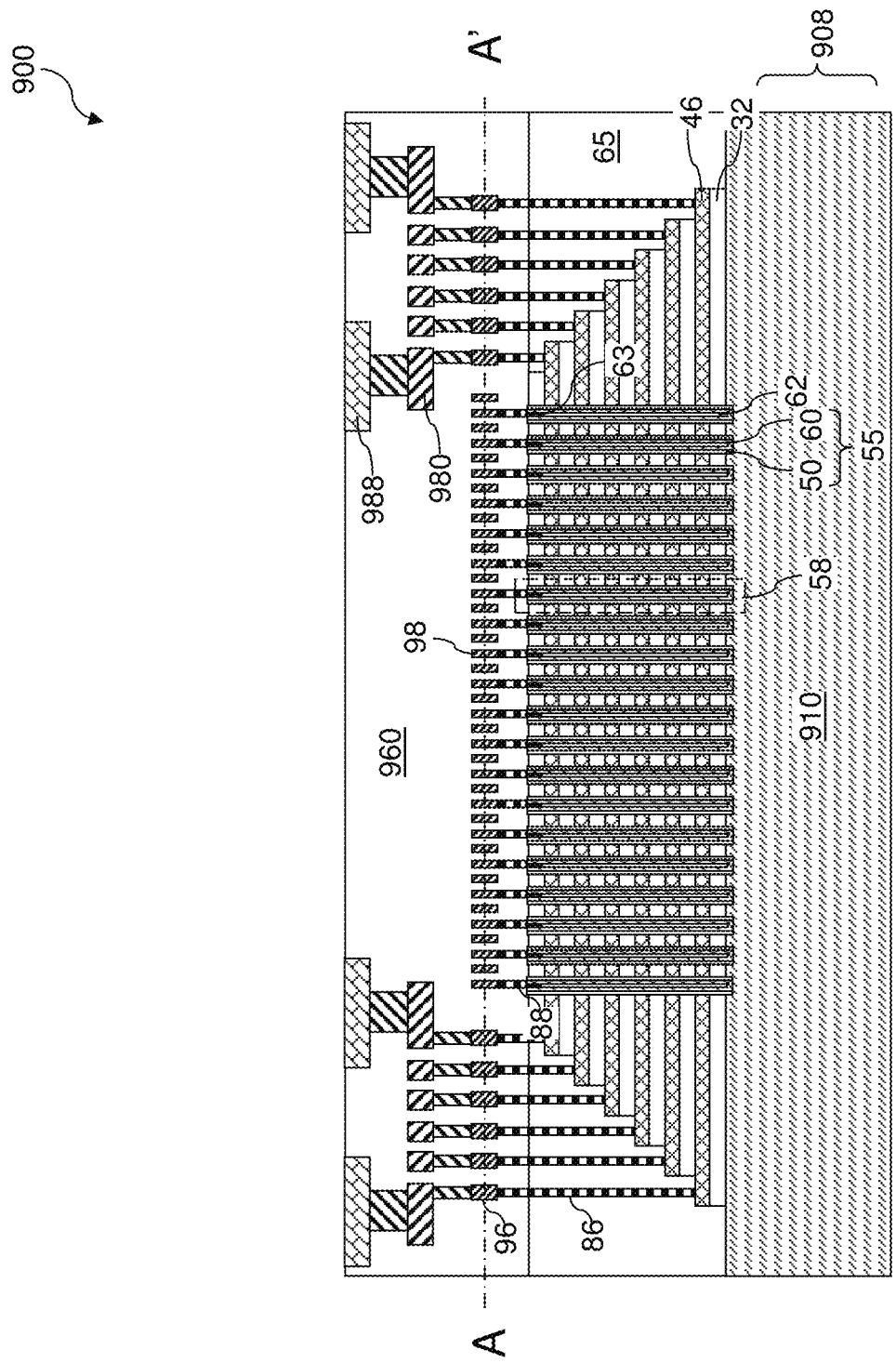
FIG. 2B is a vertical cross-sectional view along the hinged vertical plane B-B' of the region of the exemplary structure of FIG. 2A. The horizontal plane A-A' is the plane of the horizontal cross-sectional view of FIG. 2A.
Figure 2C:
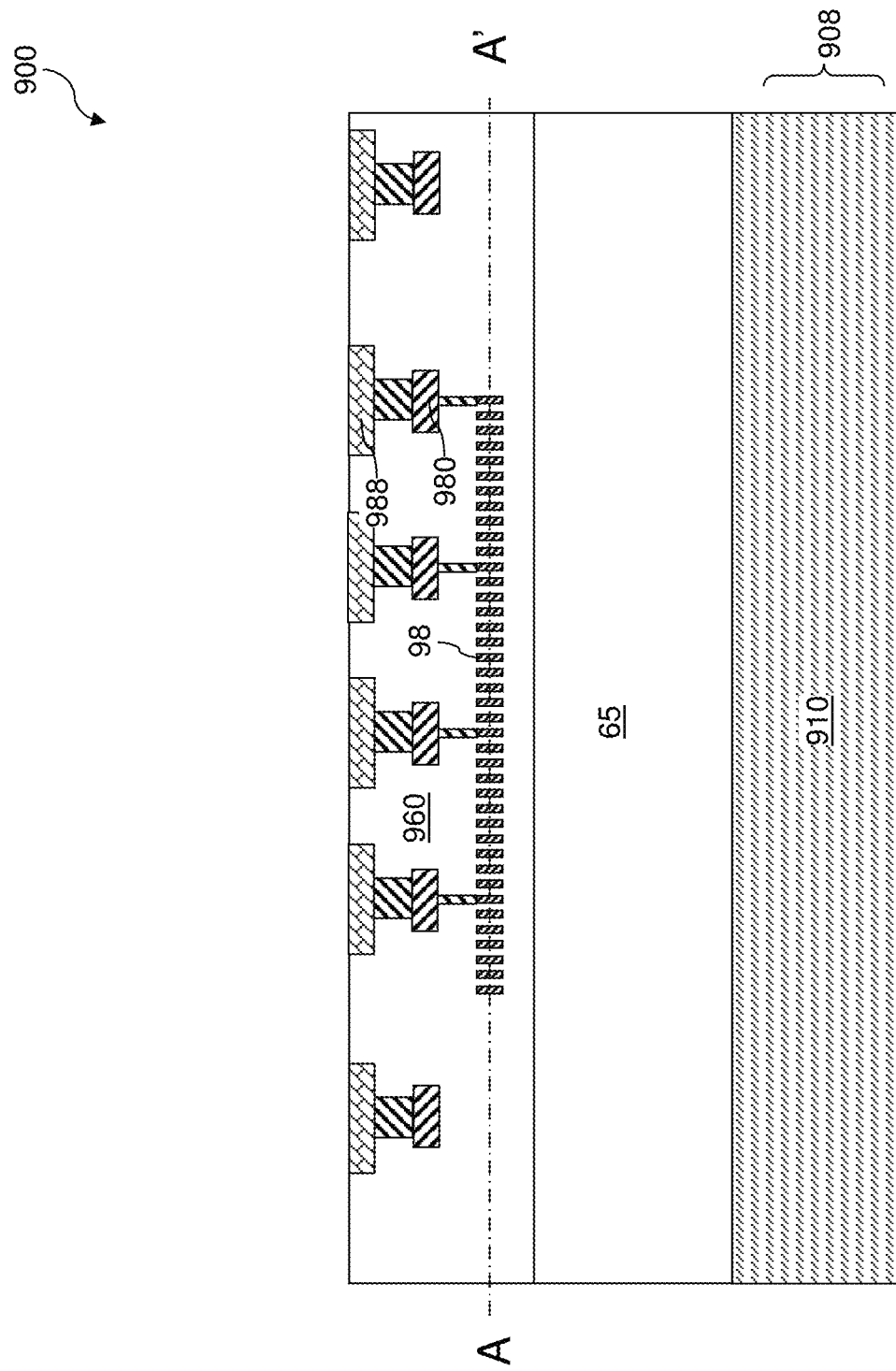
FIG. 2C is a vertical cross-sectional view along the hinged vertical plane C-C' of the region of the exemplary structure of FIG. 2A. The horizontal plane A-A' is the plane of the horizontal cross-sectional view of FIG. 2A.
Figure 2D:
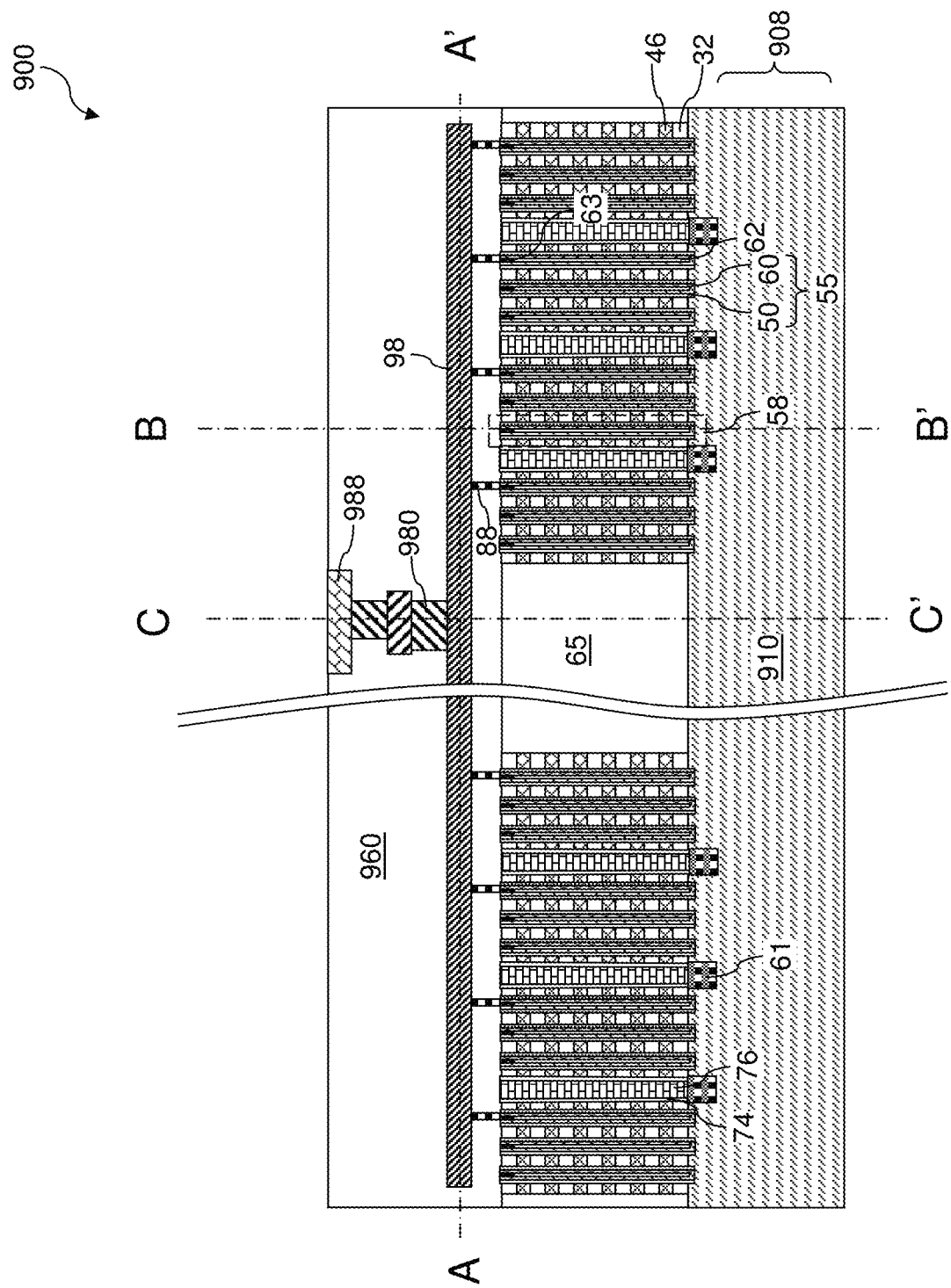
FIG. 2D is a vertical cross-sectional view along the hinged vertical plane D-D' of the region of the exemplary structure of FIG. 2A. The horizontal plane A-A' is the plane of the horizontal cross-sectional view of FIG. 2A. The vertical plane B-B' is the plane of the horizontal cross-sectional view of FIG. 2B. The vertical plane C-C' is the plane of the horizontal cross-sectional view of FIG. 2C.

Referring to FIG. 1B, a plan view of an exemplary logic die 700 according to the first embodiment of the present disclosure is illustrated. The logic die 700 can have the same size as the memory die 900 illustrated in FIG. 1A, and can be divided into a same number of plane logic regions (which is also referred to as "planes" for brevity) (Q0-Q3) as the number of planes (P0-P3) in the memory die 900. Generally, the layout of each plane (Q0-Q3) can be similar to a mirror image of the layout of the memory die 900 to minimize electrical routing distances for the metal interconnect structures employed within the logic die 700. The logic die 700 includes logic (i.e., driver/peripheral) circuits that can be employed to control operation of the three-dimensional array of memory elements within the memory die 900. Each plane (Q0-Q3) can include logic-side word-line hookup regions 722 and logic-side bit-line hookup regions 711. The logic-side word-line hookup regions 722 includes word line driver circuits and logic-side bonding pads electrically connected to the word line driver circuits. The logic-side bit-line hookup regions 711 includes sense amplifiers and bit line bias circuits (i.e., bit line drivers) and logic-side bonding pads electrically connected to the sense amplifiers and the bit line bias circuits. The areas of the logic die that are not occupied by the logic-side word-line hookup regions 722 or the logic-side bit-line hookup regions 711 can be occupied by additional circuits of a peripheral circuitry that are needed for operation of the memory die 900. For example, such areas can be occupied by bit line decoders, word line decoders, power supply circuits, data buffers, input/output circuits, etc.

Referring to FIGS. 2A-2D, structural elements within the memory die 900 of FIG. 1A are illustrated in various views. The memory die 900 can include a memory-side substrate 908 that includes a memory-side substrate semiconductor layer 910, which is a semiconductor material layer. The memory-side substrate 908 may include a commercially available single crystalline semiconductor substrate such as a single crystalline silicon wafer. The memory-side substrate semiconductor layer 910 can be an epitaxial silicon layer or a doped well in the silicon wafer and have a doping of a first conductivity type at an atomic concentration in a range from $1.0 \times 10^{14}/cm^3$ to $1.0 \times 10^{18}/cm^3$, although lesser and greater atomic concentrations may also be employed.

At least one alternating stack of insulating layers 32 and spacer material layers can be formed over the memory-side substrate 908. The spacer material layers are formed are, or are subsequently replaced with, electrically conductive layers 46, which function as word lines and select gate electrodes. Each alternating stack (32, 46) can be patterned to form stepped surfaces. The area including the stepped surfaces constitute the staircase region 200. Dielectric material portions 65 can be formed over the stepped surfaces. Further, additional dielectric material portions 65 can be formed between alternating stacks (32, 46) that are laterally spaced apart. Memory openings are formed through the portions of the alternating stack in which each layer of the alternating stack is present, i.e., within a memory array region 100. Memory opening fill structures 58 are formed within the memory openings. Each of the memory opening fill structures comprises a respective set of a memory film 50, a vertical semiconductor channel 60, and a drain region 63, and optionally includes a dielectric core 62. Each contiguous combination of a vertical semiconductor channel 60 and a memory film 50 constitutes a memory stack structure 55. Each memory film 50 includes a vertical stack of memory elements that are located at levels of the electrically conductive layers 46. In one embodiment, each memory film 50 may include a layer stack including, from outside to inside, a blocking dielectric layer, a charge storage layer or a vertical stack of discrete charge storage material portions (e.g., floating gates or discrete charge storage dielectric portions), and a tunneling dielectric layer. Portions of the charge storage layer located at levels of the electrically conductive layers, or the vertical stack of discrete charge storage material portions constitute a vertical stack of memory elements. The drain regions 63 are formed at a top end portion of a respective one of the vertical semiconductor channels 60.

In case the spacer material layers are formed as sacrificial material layers, backside trenches laterally extending along the first horizontal direction can be formed though the alternating stacks such that each alternating stack is divided into a respective plurality of alternating stacks by the backside trenches. Source regions 61 can be formed at the bottom of each backside trench, and the sacrificial material layers can be removed selective to the insulating layers 32 and the memory opening fill structures 58. Backside recesses are formed in volumes from which the sacrificial material layers are removed. The electrically conductive layers 46 can be formed by depositing at least one electrically conductive material in the backside recesses and removing excess portions of the electrically conductive material from inside the backside trenches and from above the alternating stacks. Each backside trench can be filled with a respective backside trench fill structure, which may include, for example, an insulating spacer 74 and a backside contact via structure 76 that can function as a source contact via structure.

The memory die 900 comprises a three-dimensional memory array including a three-dimensional array of memory elements that includes portions of the memory films 50 that are located adjacent to a respective one of vertical semiconductor channels 60. The electrically conductive layers 46 comprise word lines and select gate lines of the three-dimensional memory array. A contact-level dielectric layer can be formed over the alternating stacks (32, 46), and various contact via structures can be formed through the contact-level dielectric layer. For example, layer contact via structures 86 can be formed directly on a surface of a respective one of the electrically conductive layers 46, and drain contact via structures 88 can be formed directly on a top surface of a respective one of the drain regions 63. Bit lines 98 can be formed over the memory opening fill structures 58. Each of the bit lines 98 can be electrically connected to a respective subset of the drain regions 63 through a respective set of drain contact via structures 88. Word-line-connection metal lines 96 can be formed on a respective one of the layer contact via structures 86. Memory-side metal interconnect structures 980 embedded within memory-side dielectric material layers 960 can be formed. The memory-side dielectric material layers 960 include the contact-level dielectric layer. Memory-side bonding pads 988 can be formed within a top portion of the memory-side dielectric material layers 960. Thus, the memory die 900 comprising a three-dimensional memory array and memory-side bonding pads 988 can be provided.

Referring to FIGS. 3A-3E, structural elements within the logic die 700 of FIG. 1B are illustrated in various views. The logic die 700 can include a logic-side substrate 708 that includes a logic-side substrate semiconductor layer 710, which is a semiconductor material layer (e.g., an epitaxial layer or a doped well in the substrate 708). The logic-side substrate 708 may include a commercially available single crystalline semiconductor substrate, such as a single crystalline silicon wafer. Field effect transistors 702 can be formed on the logic-side substrate semiconductor layer 710. The field effect transistors include a respective semiconductor channel comprising a portion of, or comprising a same material as, the logic-side substrate semiconductor layer 710 in the logic-side substrate. Thus, the field effect transistors are herein referred to as substrate field effect transistors 702. The substrate field effect transistors 702 may comprise conventional planar (i.e., lateral/horizontal) field effect transistors, fin field effect transistors, or gate-all-around field effect transistors, which may be arranged in a CMOS configuration. Generally, the substrate field effect transistors 702 can comprise active regions 742 (such as source regions and drain regions), semiconductor channels 746 (which extend parallel to the top surface of the substrate 708), and a gate structures 750. Each gate structure 750 may include a gate dielectric 752, a gate electrode 754, a gate cap dielectric 758, and an optional gate spacer 756, Shallow trench isolation structures 712 may be formed in an upper portion of the logic-side substrate semiconductor layer 710 to provide electrical isolation among the substrate field effect transistors. A dielectric liner 766 (such as a silicon nitride liner) may be formed over the substrate field effect transistors to block diffusion of impurities and hydrogen, and/or to provide stress effects to the substrate field effect transistors.

The substrate field effect transistors collectively form a peripheral circuit 720, which is a logic circuit that is configured to control operation of the three-dimensional memory array within the memory die 900. The peripheral circuit 720 includes sense amplifier circuits and bit line bias circuits. A first subset of the logic-side metal interconnect structures 780, which is herein referred to as lower logic-side metal interconnect structures 780A, can be formed over the substrate field effect transistors. The lower logic-side metal interconnect structures 780 can be embedded in a first subset of logic-side dielectric material layers 760, which is herein referred to as first dielectric material layers. The lower logic-side metal interconnect structures comprise metallic bottom pads 781, which can be arranged within areas of vertical field effect transistors to be subsequently formed. In one embodiment, the metallic bottom pads 781 may be formed within the areas of the sense amplifier circuits and the bit line bias circuits, and/or outside the areas of the amplifier circuits and the bit line bias circuits.

At least one set of vertical field effect transistors 20 can be formed over the logic-side substrate 708. Each set of vertical field effect transistors 20 shares a common gate electrode 16. Each set of vertical field effect transistor 20 can be formed by forming bottom electrodes 22 (e.g., heavily doped semiconductor electrodes) embedded within the lower logic-side dielectric material layers over the logic-side substrate 708, forming a gate electrode 16 including a plurality of vertically-extending openings therethrough such that the bottom electrodes 22 are exposed underneath the vertically-extending openings, forming a combination of a cylindrical gate dielectric 24 and a vertical transistor channel 26 within each of the vertically-extending openings, and forming top electrodes 30 (e.g., heavily doped semiconductor electrodes) on the vertical transistor channels 26. The bottom and top electrodes (22, 30) that contact the vertical transistor channels 26 function as source and drain regions over the vertical field effect transistors 20. Optionally, a dielectric channel core 28 can be formed within each vertical transistor channel 26. The method of forming the least one set of vertical field effect transistors 20 are described in detail in a subsequent section. In one embodiment, the vertical transistor channels 26 comprises, and/or consist essentially of, a respective elemental semiconductor material (e.g., polysilicon) or a respective III-V compound semiconductor material. In one embodiment, each gate electrode 16 of each set of vertical field effect transistors 20 comprises a respective elemental semiconductor material (e.g., heavily doped polysilicon) or a respective III-V compound semiconductor material. The vertical field effect transistors 20 may comprise vertical thin film transistors.

In another embodiment, the vertical transistor channel 26 may comprise a wide band gap metal oxide semiconductor material. Examples of metal oxide semiconductor materials include indium gallium zinc oxide (IGZO), indium zinc oxide, hafnium indium zinc oxide, zirconium indium zinc oxide, zirconium indium tin oxide, and zinc indium tin oxide. The metal oxide semiconductor channel material allows better scaling and smaller chip size, particularly for the bonded assembly of logic and memory die. The metal oxide semiconductor channel containing vertical TFT decoders provide a smaller vertical size, better performance including improved breakdown voltage and carrier mobility, and improved power and reliability characteristics (e.g., improved on-current and lower leakage current) for three-dimensional NAND memory device. For example, the gate dielectric 24 thickness may be reduced 25 nm or less, such as 20 to 25 nm, and the metal oxide semiconductor channel length may be reduced to 1 micron or less, such as 0.3 to 0.8 microns to achieve a breakdown voltage of at least 30 V with acceptable on, off and leakage current.

Figure 3A:
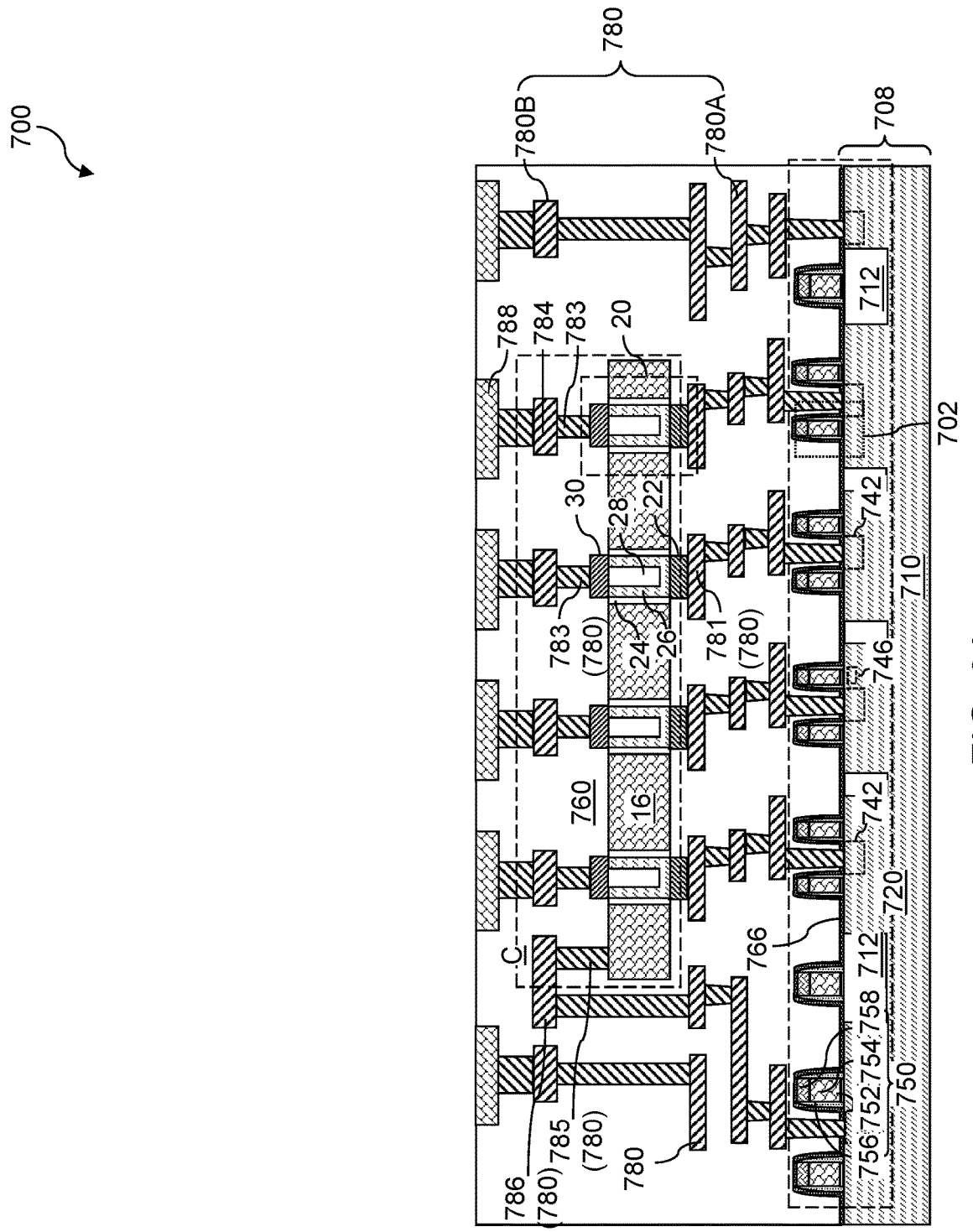
FIG. 3A is a first vertical cross-sectional view of a region of the exemplary logic die of FIG. 1B according to the first embodiment of the present disclosure.
Figure 3B:
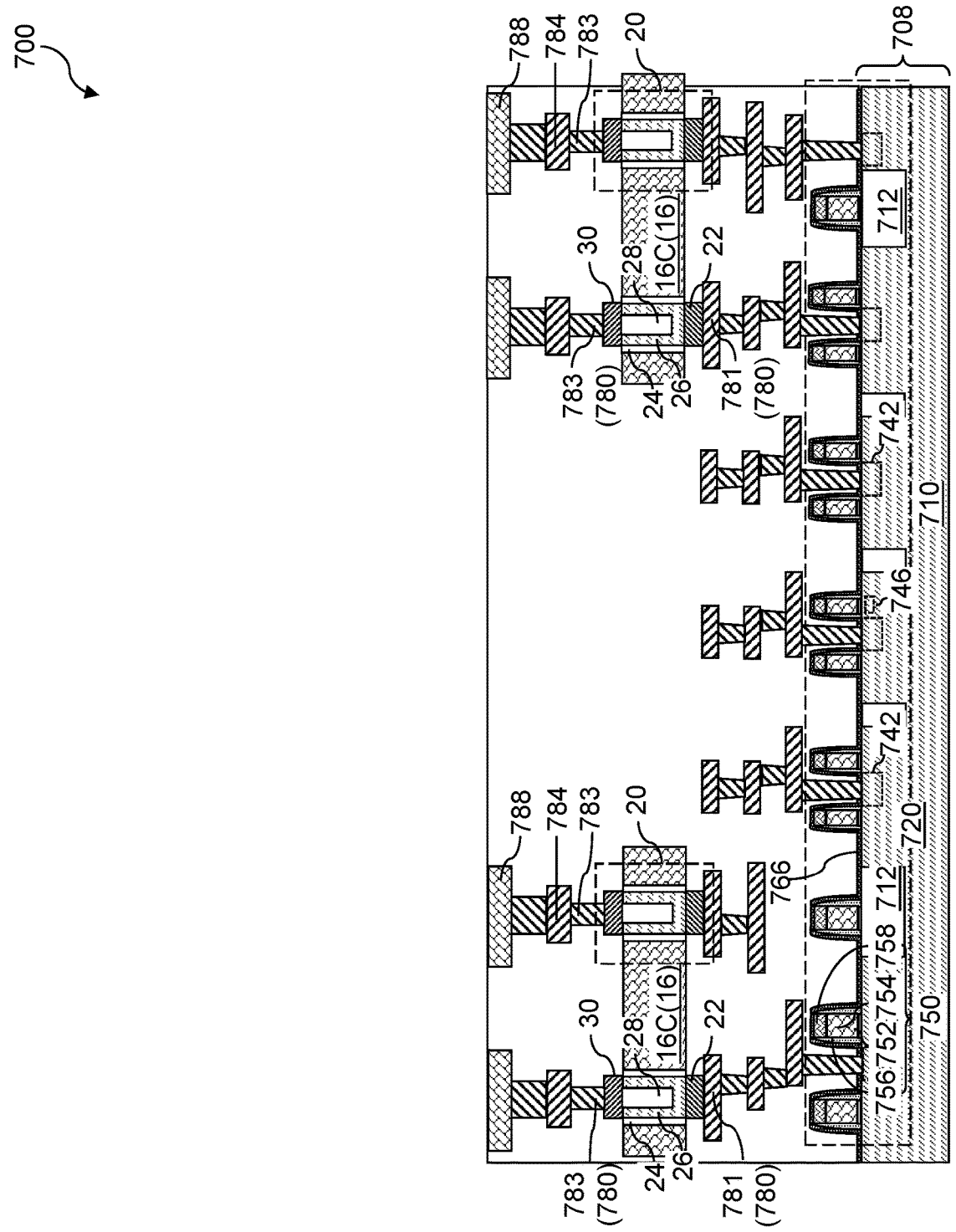
FIG. 3B is a second vertical cross-sectional view of a region of the exemplary logic die of FIG. 1B.

The metal oxide semiconductor materials, such as IGZO may be deposited by chemical vapor deposition (e.g., in an argon-oxygen mixture at a temperature of about 300 C), atomic layer deposition or by low temperature physical vapor deposition (e.g., using radio frequency controlled physical vapor deposition in a controlled oxygen ambient at a temperature of about 300 C). Control of excessive oxygen during IGZO deposition may lead to improved IGZO film quality. For example, oxygen pressure control may be used to control charge carrier (e.g., electron) concentration/conductivity in the IGZO film. For example, oxygen partial pressure of 1 to 3 Pascals may yield a charge carrier concentration of about $5 \times 10^{19}$ $cm^{-3}$ for IGZO films in which the atomic ratio of In:Ga:Zn=1:1:1. The IGZO film may be subjected to a $N_2O$ plasma treatment for improved control channel conductivity and/or subjected to an anneal at 550 K to 650 K (i.e., 277 C to 377 C), such as about 600K for 45 to 90 minutes, such as about 60 minutes for more stable bonding. IGZO may be wet etched with diluted hydrofluoric acid. In embodiments where dielectric channel core 28 is present (e.g., as shown in FIG. 3A), the metal oxide semiconductor vertical transistor channel 26 may have a thickness of 6 nm to 20 nm. Alternatively, the dielectric channel core 28 may be omitted, as shown in FIG. 6K.

In the embodiment in which the semiconductor channel material comprises a metal oxide material, such as IGZO, each of the bottom electrode 22 and the top electrode 30 may comprise a metal or metal nitride, a heavily doped semiconductor or a n-type IGZO. For example, the bottom electrode 22 and/or the top electrode 30 may comprise Ti, TiN, a Ti/Au stack or a Ni/Au stack. Alternatively, the bottom electrode 22 and/or the top electrode 30 may comprise heavily doped polysilicon (e.g., phosphorus doped n-type polysilicon). Alternatively, the bottom electrode 22 and/or the top electrode 30 may comprise n-type IGZO. N-type IGZO may be formed by treatment of IGZO with argon and nitrogen containing (e.g., ammonia) plasma, or by implanting argon and/or nitrogen ions into the IGZO. Alternatively, the bottom electrode 22 may comprise a stack of a metal or metal nitride located below an n-type semiconductor material, such as n-type polysilicon or n-type IGZO, while the top electrode 30 may comprise a stack of a metal or metal nitride located above an n-type semiconductor material, such as n-type polysilicon or n-type IGZO. The n-type semiconductor material may be etched back after deposition.

The bottom electrodes 22 of the at least one set of vertical field effect transistors 20 can be electrically connected to a first subset of the substrate field effect transistors via a first subset of lower logic-side metal interconnect structures 780A embedded within the lower logic-side dielectric material layers 760. A second subset of the logic-side metal interconnect structures 780 can be subsequently formed over the vertical field effect transistors 20. The second subset of the logic-side metal interconnect structures 780 are herein referred to as second metal interconnect structures, and are embedded in a second subset of the logic-side dielectric material layers 760. The second subset of the logic-side metal interconnect structures 780 may include upper electrode contact via structures 783 each contacting a respective one of the top electrodes 30, and upper-electrode-connection metal lines 784 each contacting at least one of the upper electrode contact via structures 783, and thus, is electrically connected to at least one of the top electrodes 30. The second subset of the logic-side metal interconnect structures 780 may include gate contact via structures 785 each contacting a respective one of the gate electrodes 16, and gate-connection metal lines 786 each contacting a top surface of a respective gate contact via structure 785 and located at the same level as the upper-electrode-connection metal lines 784. Logic-side bonding pads 788 can be formed in a top portion of the logic-side dielectric material layers 760. The logic-side bonding pad 788 can be electrically connected to the substrate field effect transistors and/or to the upper-electrode-connection metal lines 784 through a respective subset of the logic-side metal interconnect structures 780.

Figure 3C:
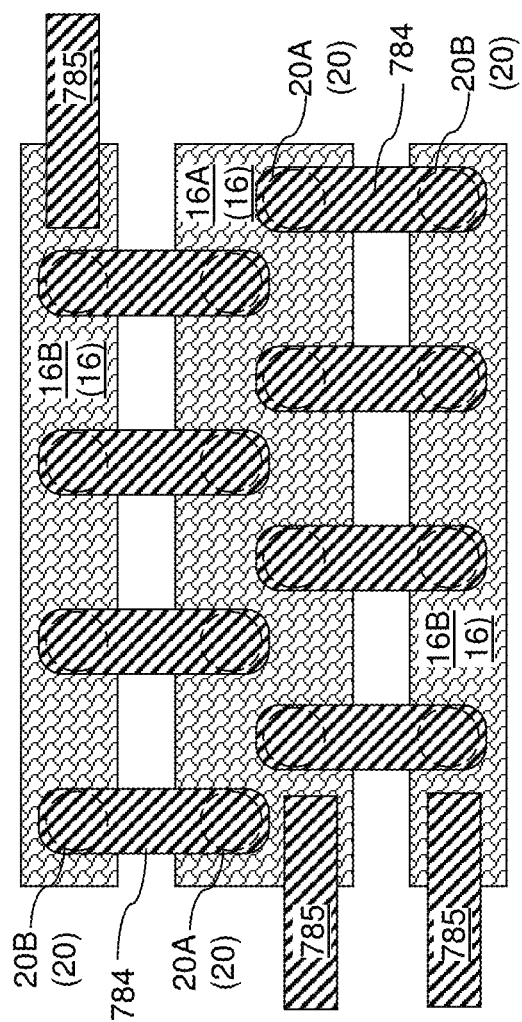
FIG. 3C is a first exemplary layout of the region C in FIG. 3A.
Figure 3D:
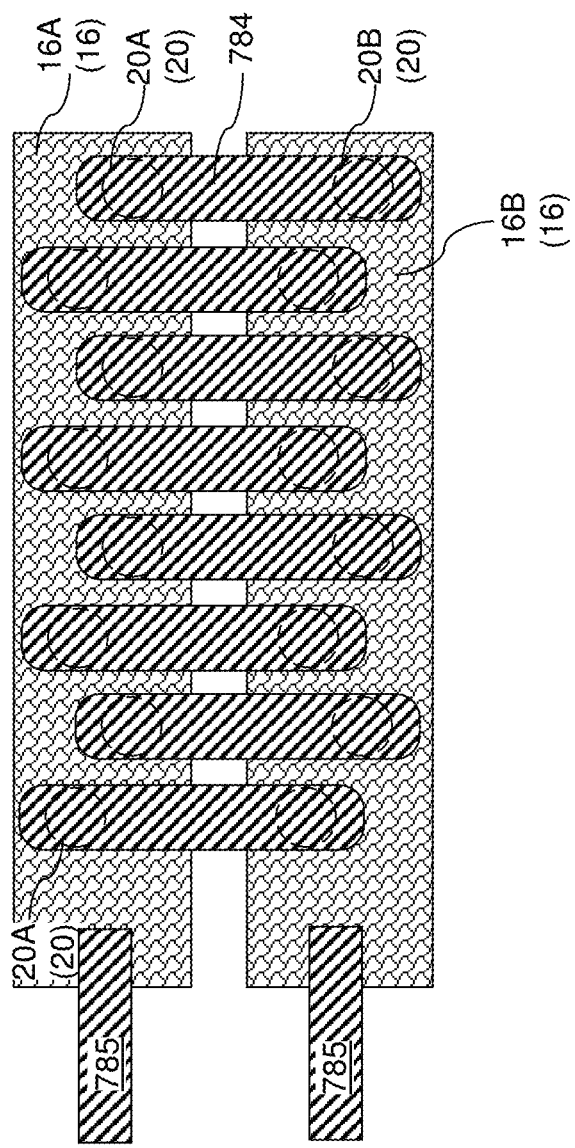
FIG. 3D is a second exemplary layout of the region C in FIG. 3A.

In one embodiment, the at least one set of vertical field effect transistors 20 can comprise a plurality of sets of vertical field effect transistors 20. In one embodiment, the at least one set of vertical field effect transistors 20 can comprise a first set of vertical field effect transistors 20A including a respective bottom electrode 22 that is electrically connected to a respective one of the sense amplifier circuits and sharing a first gate electrode 16A (as illustrated in FIG. 3C or 3D), and a second set of vertical field effect transistors 20B including a respective bottom electrode 22 that is electrically connected to a respective one of the bit line bias circuits and sharing a second gate electrode 16B that is located adjacent to, and laterally spaced from, the first gate electrode 16A. The upper-electrode-connection metal lines 784 can be electrically connected to a respective set of a top electrode 30 within the first set of vertical field effect transistors 20 and a top electrode 30 within the second set of vertical field effect transistors. Further, the upper-electrode-connection metal lines 784 can be subsequently connected to a respective one of the bit lines in the three-dimensional memory array in the memory die 900. During operation, the first set of vertical field effect transistors 20 can be turned on and the second set of vertical field effect transistors 20 can be turned off to electrically connect the upper-electrode-connection metal lines 784 to the sense amplifier circuits (e.g., during a read operation on the three-dimensional memory array), or the first set of vertical field effect transistors 20 can be turned off and the second set of vertical field effect transistors 20 can be turned on to electrically connect the upper-electrode-connection metal lines 784 to the bit line bias circuits e.g., during an erase operation on the three-dimensional memory array). Thus, the combination of the first set of vertical field effect transistors 20 and the second set of vertical field effect transistors 20 can function as an electrical switch for the bit lines of the three-dimensional memory array.

Figure 3E:
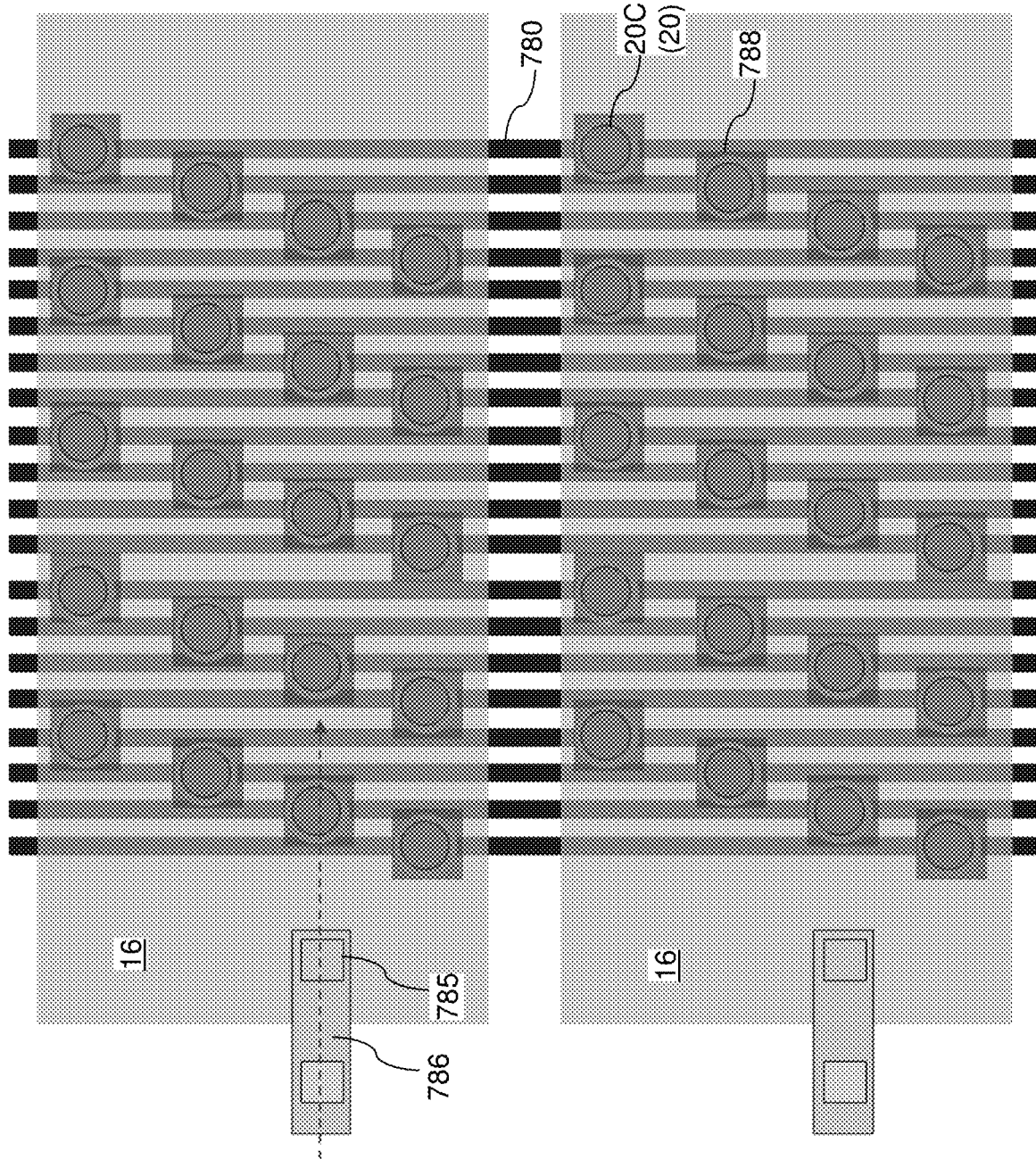
FIG. 3E is an exemplary layout of vertical field effect transistors and logic-side bonding pads within the exemplary memory die of FIGS. 2A and 2B.

In one embodiment, the at least one set of vertical field effect transistors 20 can comprise at least one set of vertical field effect transistors 20C (as illustrated in FIG. 3E) including a respective bottom electrode 22 that is electrically connected to a respective output node of a word line driver provided within the peripheral circuit 720. The upper-electrode-connection metal lines 784 can be electrically connected to a respective top electrode 30 and multiple electrically conductive layers (e.g., word lines) located in different alternating stacks (32, 46) and at a same vertical spacing from the memory-side substrate 908. During operation, each set of vertical field effect transistors 20 can be turned on or turned off.

Generally, upper logic-side metal interconnect structures 780B embedded within the upper logic-side dielectric material layers can be formed over the at least one set of vertical field effect transistors 20. The upper logic-side metal interconnect structures 780B electrically connect the upper electrodes 30 of the at least one set of vertical field effect transistors 20 to the logic-side bonding pads 788. The logic-side bonding pads 788 are embedded in the upper logic-side dielectric material layers 760, and are electrically connected to a respective one of the top electrodes 30 over the at least one set of vertical field effect transistors 20. The pattern of the logic-side bonding pads 788 may overlap with the pattern of the underlying vertical field effect transistors 20 (as illustrated in FIG. 3E). The total number of a set of vertical field effect transistors 20 sharing a same gate electrode 16 and employed to drive the bit lines 98 may be the same as a total number N of the bit lines 98, or a fraction of the total number N of the bit lines 98. The total number of a set of vertical field effect transistors 20 sharing a same gate electrode 16 and employed to drive the word lines may be the same as a total number M of the word lines (as embodied as the electrically conductive layers 46), or a fraction of the total number M of the word lines.

Figure 4A:
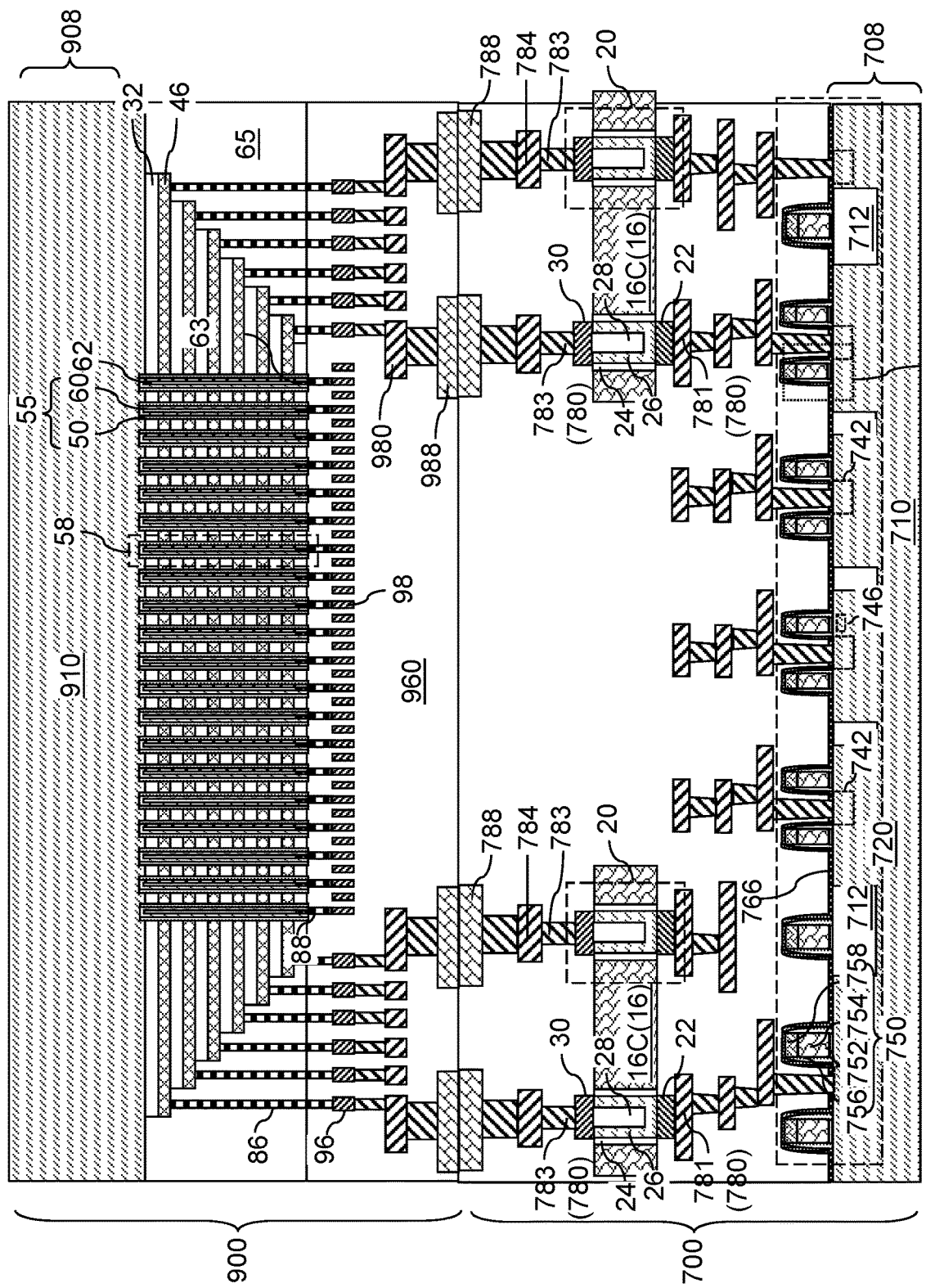
FIG. 4A is a first vertical cross-sectional vie of an exemplary bonded assembly is along a vertical plane that corresponds the vertical planes of FIG. 2B and FIG. 3A according to the first embodiment of the present disclosure.
Figure 4B:
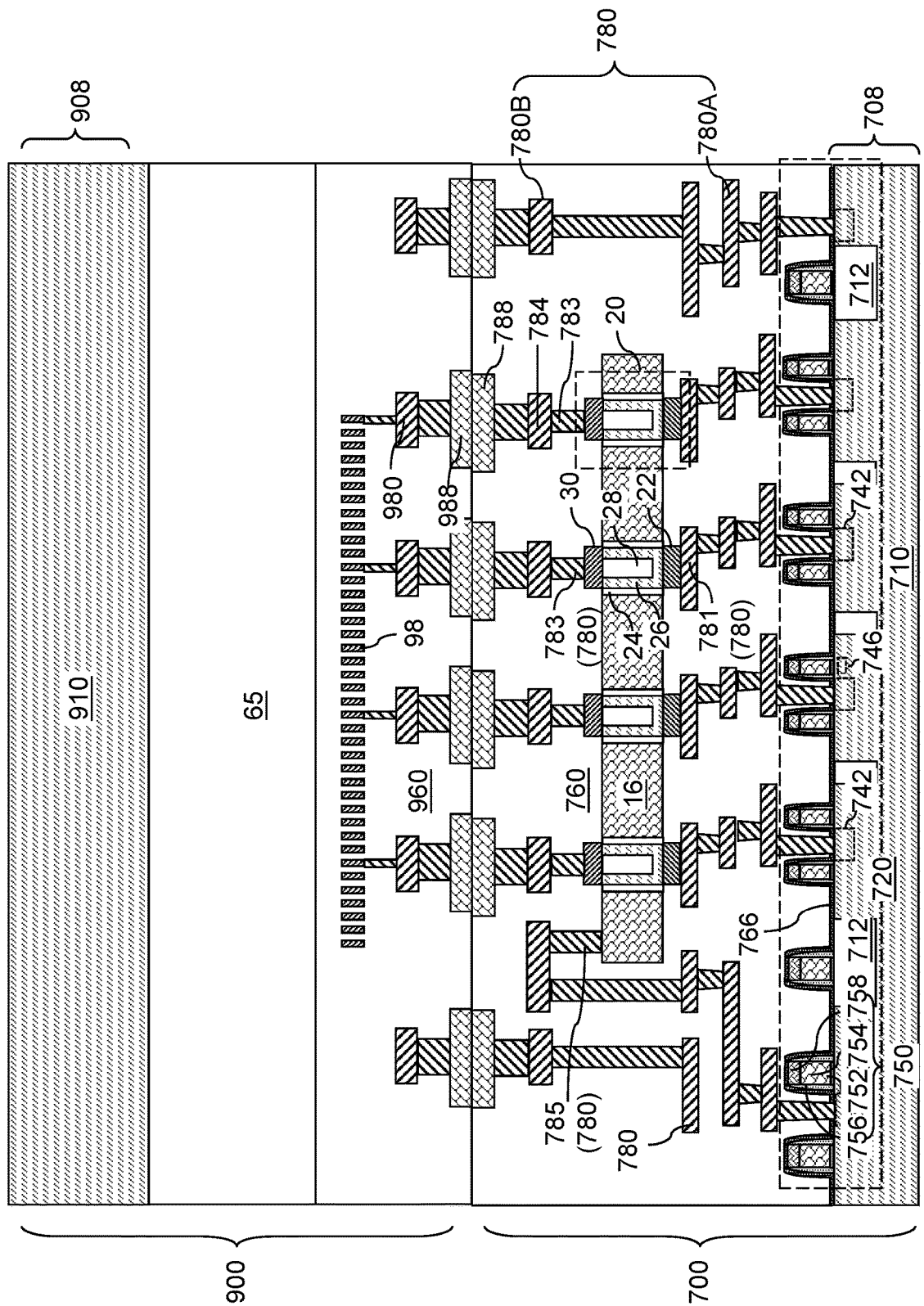
FIG. 4B is a second vertical cross-sectional view of the exemplary bonded assembly along a vertical plane that corresponds to the hinged vertical planes of FIG. 2C and FIG. 3B according to the first embodiment of the present disclosure.

Referring to FIGS. 4A and 4B, the memory die 900 and the logic die 700 can be bonded to each other, for example, by metal-to-metal bonding or by hybrid bonding. Each memory-side bonding pad 988 can be bonded to a respective one of the logic-side bonding pads 788. In one embodiment, a subset of the top electrodes 30 of the at least one set of vertical field effect transistors 20 can be electrically connected to a respective one of the bit lines 98. Additionally or alternatively, another subset of the top electrodes 30 of the at least one set of vertical field effect transistors 20 can be electrically connected to a respective one of the word lines (i.e., the electrically conductive layers 46) via mating pairs of the memory-side bonding pads 988 and the logic-side bonding pads 788.

Figure 5:
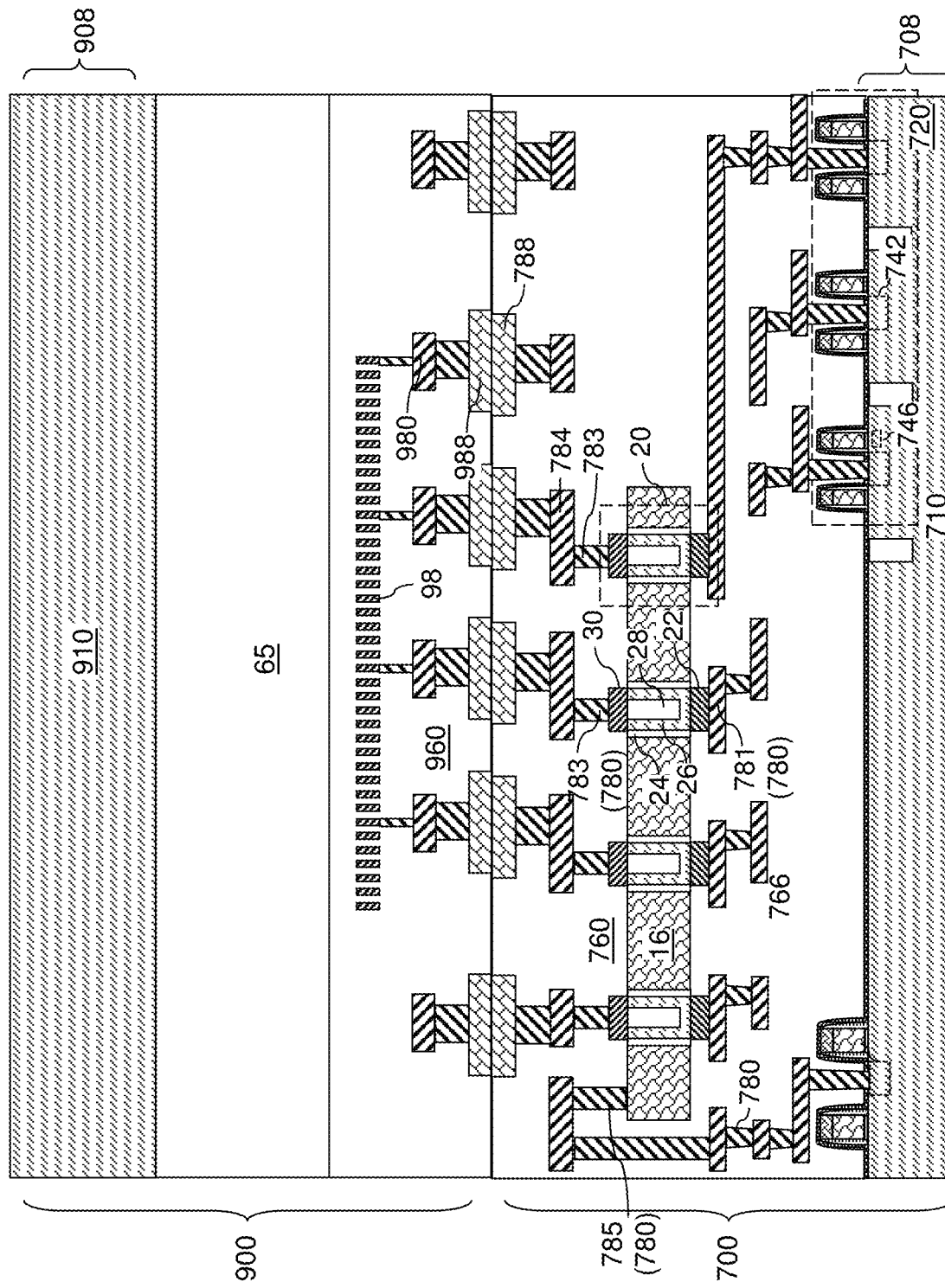
FIG. 5 is a vertical cross-sectional view of an alternative embodiment of the exemplary bonded assembly according to the first embodiment of the present disclosure.

Referring to FIG. 5, an alternative embodiment of the first exemplary structure is illustrated, which can be derived from the first exemplary structure by rearranging the layout of the substrate field effect transistors 702 such that the areas of the vertical field effect transistors 20 is laterally offset, at least partially, from the area of the sense amplifier circuits and the bit line bias circuits. Generally, the percentage overlap between the total area of the at least one set of vertical field effect transistors 20 and the total area including each sense amplifier circuit and each bit line bias circuit may be from 0% to 100% of the lesser of the total area of the at least one set of vertical field effect transistors 20 and the total area including each sense amplifier circuit and each bit line bias circuit.

FIGS. 6A-6J are sequential vertical cross-sectional views of a region of the exemplary logic die 700 during formation of a set of vertical field effect transistors 20 according to an embodiment of the present disclosure.

Referring to FIG. 6A, a region of the logic die 700 for forming a set of vertical field effect transistors 20 is illustrated after formation of the metallic bottom pads 781. The metallic bottom pads 781 are a subset of the lower logic-side metal interconnect structures 780A, and can be embedded within a line-level dielectric material layer 761, which is a subset of the lower logic-side dielectric material layers of the logic die 700. The line-level dielectric material layer 761 includes a dielectric material such as undoped silicate glass, a doped silicate glass, or organosilicate glass. The thickness of the metallic bottom pads 781 may be in a range from 50 nm to 200 nm, although lesser and greater thicknesses may also be employed. The metallic bottom pads 781 may include Cu, W, Ru, Co, Mo, TiN, TaN, WN, or any metallic material that can be employed for interconnect-level metal structures. The lateral dimensions (such as a diameter) of the metallic bottom pads 781 may be in a range from 300 nm to 1,000 nm, although lesser and greater lateral dimensions may also be employed.

Referring to FIG. 6B, a bottom-pad-level dielectric material layer 762 can be formed over the metallic bottom pads 781. The bottom-pad-level dielectric material layer 762 includes a dielectric material such as undoped silicate glass, a doped silicate glass, or organosilicate glass. The thickness of the bottom-pad-level dielectric material layer 762 may be in a range from 50 nm to 200 nm, although lesser and greater thicknesses may also be employed. Pad cavities are formed within the bottom-pad-level dielectric material layer 762 over each of the metallic bottom pads 781. An electrode material, such as a metal, metal nitride and/or doped semiconductor material can be deposited in the pad cavities directly on physically exposed surfaces of the metallic bottom pads 781. The doped semiconductor material may include a respective doped elemental semiconductor material (such as silicon (e.g., polysilicon), germanium, or a silicon-germanium alloy), a respective III-V compound semiconductor material (such as GaAs) or n-type IGZO described above. The doped semiconductor material can include electrical dopants (which may be p-type dopants or n-type dopants) at an atomic concentration in a range from $5.0 \times 10^{18}/cm^3$ to $2.0 \times 10^{21}/cm^3$, although lesser and greater atomic concentrations may also be employed. Excess portions of the electrode material can be removed from above the horizontal plane including the top surface of the bottom-pad-level dielectric material layer 762. Remaining portions of the electrode material comprise bottom electrodes 22.

Referring to FIG. 6C, a gate-level dielectric material layer 763 can be deposited over the bottom-pad-level dielectric material layer 762. The gate-level dielectric material layer 763 includes a dielectric material such as undoped silicate glass, a doped silicate glass, or organosilicate glass. The thickness of the gate-level dielectric material layer 763 may be in a range from 300 nm to 2,000 nm, such as from 500 nm to 1,000 nm, although lesser and greater thicknesses may also be employed. A photoresist layer (not shown) can be applied over the gate-level dielectric material layer 763, and can be lithographically patterned to form openings therein. Each opening in the photoresist layer may overlie a set of bottom electrodes 22 that are employed to form a set of vertical field effect transistors 20 that are controlled by a same gate electrode. An anisotropic etch process can be performed to form a recess cavity, which is herein referred to as a gate cavity 15, within each opening in the photoresist layer. An array of bottom electrodes 22 can be physically exposed at the bottom of each gate cavity 15. The photoresist layer can be subsequently removed, for example, by ashing.

Referring to FIG. 6D, a gate electrode material can be deposited in the gate cavities 15. The gate electrode material can include a doped semiconductor material (such as heavily doped polysilicon) or a metallic material (such as TiN, TaN, WN, W, or any of metal gate materials known in the art). The gate electrode material may be deposited as a blanket conductive material layer, i.e., an unpatterned conductive material layer. Excess portions of the gate electrode material can be removed from outside the gate cavities 15, i.e., from above the horizontal plane including the top surface of the gate-level dielectric material layer 763, by a planarization process such as a chemical mechanical planarization process. Each remaining portion of the gate electrode material that fills a gate cavity 15 comprises a gate electrode 16. In one embodiment, each gate electrode 16 comprises a respective elemental semiconductor material or a respective III-V compound semiconductor material.

Referring to FIG. 6E, a photoresist layer (not shown) can be applied over the gate-level dielectric material layer 763 and the gate electrodes 16, and can be lithographically patterned to form an opening over each area of the bottom electrodes 22. In one embodiment, the periphery of each opening in the photoresist layer may be laterally offset outward from a periphery of a respective underlying bottom electrode 22. An anisotropic etch process can be performed to transfer the pattern of the openings in the photoresist layer through each gate electrode 16. The anisotropic etch can be terminated upon physical exposure of the top surfaces of the bottom electrodes 22. In one embodiment, each bottom electrode 22 can have a top surface having a periphery that is laterally offset inward from a bottom periphery of an overlying opening through a gate electrode 16. A channel cavity 21 is formed above each bottom electrode 22. Each channel cavity 21 can have a cylindrical sidewall, which is a sidewall of a gate electrode 16.

Referring to FIG. 6F, a gate dielectric material such as silicon oxide can be conformally deposited over the gate electrodes 16, the bottom electrodes 22, and the gate-level dielectric material layer 763. The gate dielectric material can be subsequently anisotropically etched to remove horizontal portions. Each vertically-extending cylindrical portion of the gate dielectric material that remains in a respective channel cavity 21 constitutes a cylindrical gate dielectric 24. The lateral thickness of each cylindrical gate dielectric 24 can be in a range from 10 nm to 60 nm, such as from 15 nm to 40 nm, although lesser and greater thicknesses may also be employed.

Figure 6G:
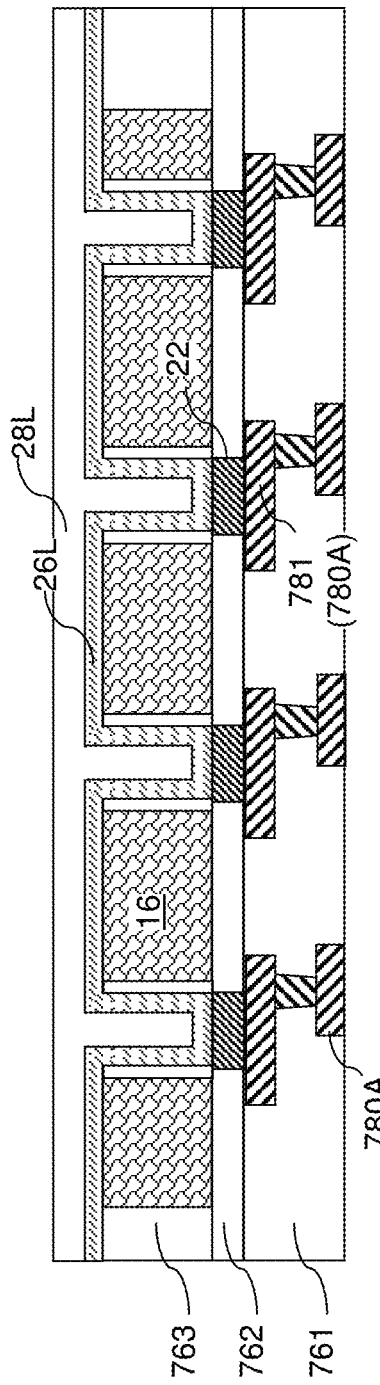

Referring to FIG. 6G, a channel semiconductor material can be conformally deposited to form a channel semiconductor layer 26L. The channel semiconductor material can include a doped or intrinsic elemental semiconductor material (e.g., intrinsic (i.e., not intentionally doped) polysilicon) or a doped III-V compound or metal oxide (e.g., IGZO) semiconductor material. The channel semiconductor material can have a doping of an opposite conductivity type as the doping of the bottom electrodes 22, thereby forming a first p-n junction at interfaces with the bottom electrodes 22. The atomic concentration of electrical dopants in the channel semiconductor material may be in a range from $1.0 \times 10^{14}/cm^3$ to $3.0 \times 10^{18}/cm^3$, although lesser and greater atomic concentrations may also be employed. The thickness of the channel semiconductor layer 26L can be in a range from 10 nm to 30 nm, although lesser and greater thicknesses may also be employed. In case the channel cavities 21 are not completely filled with the channel semiconductor layer 26L, a dielectric channel core material layer 28L can be deposited over the channel semiconductor layer 26L. The dielectric channel core material layer 28L includes a dielectric material such as silicon oxide.

Figure 6H:
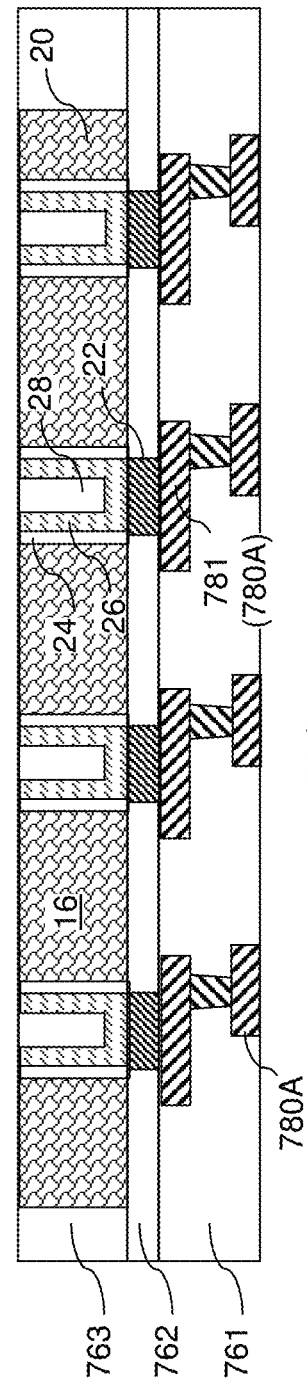

Referring to FIG. 6H, portions of the dielectric channel core material layer 28L and the channel semiconductor layer 26L located above the horizontal plane including the top surface of the gate-level dielectric material layer 763 can be removed by a chemical mechanical planarization process. Each remaining portion of the channel semiconductor layer 26L that remains in a respective channel cavity comprises a vertical transistor channel 26. Each remaining portion of the dielectric channel core material layer 28L that remains in a respective channel cavity comprises a dielectric channel core 28.

Referring to FIG. 6I, a top-pad-level dielectric material layer 764 can be formed over the gate electrodes 16 and the vertical transistor channels 26. The top-pad-level dielectric material layer 764 includes a dielectric material such as undoped silicate glass, a doped silicate glass, or organosilicate glass. The thickness of the top-pad-level dielectric material layer 764 may be in a range from 50 nm to 200 nm, although lesser and greater thicknesses may also be employed. Pad cavities are formed within the top-pad-level dielectric material layer 764 over each of the vertical transistor channels 26. An electrode material, such as a metal, a metal nitride or a doped semiconductor material can be deposited in the pad cavities directly on physically exposed surfaces of the vertical transistor channels 26. The doped semiconductor material may include a respective doped elemental semiconductor material (such as silicon (e.g., polysilicon, germanium, or a silicon-germanium alloy), a respective III-V compound semiconductor material (such as GaAs) or n-type IGZO described above. The doped semiconductor material can include electrical dopants (which may be p-type dopants or n-type dopants) of the same conductivity type as the doping of the bottom electrodes 22 at an atomic concentration in a range from $5.0 \times 10^{18}/cm^3$ to $2.0 \times 10^{21}/cm^3$, although lesser and greater atomic concentrations may also be employed. Excess portions of the electrode material can be removed from above the horizontal plane including the top surface of the top-pad-level dielectric material layer 764. Remaining portions of the electrode material comprise top electrodes 30. Each top electrode 30 is formed on a top surface of a respective vertical transistor channel 26.

Referring to FIG. 6J, an interconnect-level dielectric layer 765 can be deposited over the top-pad-level dielectric material layer 764. Via cavities and line cavities can be formed through the interconnect-level dielectric layer 765, and can be filled with at least one conductive material to form various upper logic-side metal interconnect structures 780B, which include upper electrode contact via structures 783 that contact a respective one of the top electrodes 30, upperelectrode-connection metal lines 784 that contact at least one of the upper electrode contact via structures 783, gate contact via structures 785 that contact a respective one of the gate electrodes 16, and gate-connection metal lines 786 that contact a top surface of a respective gate contact via structure 785 and located at the same level as the upper-electrode-connection metal lines 784.

Referring to FIG. 6K, a first alternative embodiment of a set of vertical field effect transistors 20 is illustrated, which can be derived from the set of vertical field effect transistors of FIG. 6J by omitting formation of the dielectric channel cores 28.

Referring to FIG. 6L, a second alternative embodiment of a set of vertical field effect transistors 20 is illustrated, which can be derived from the set of vertical field effect transistors of FIG. 6J by vertically recessing the vertical transistor channels 26 and the dielectric channel cores 28 prior to formation of the top electrodes 30 and omitting the top-pad-level dielectric material layer 764.

Figure 6M:
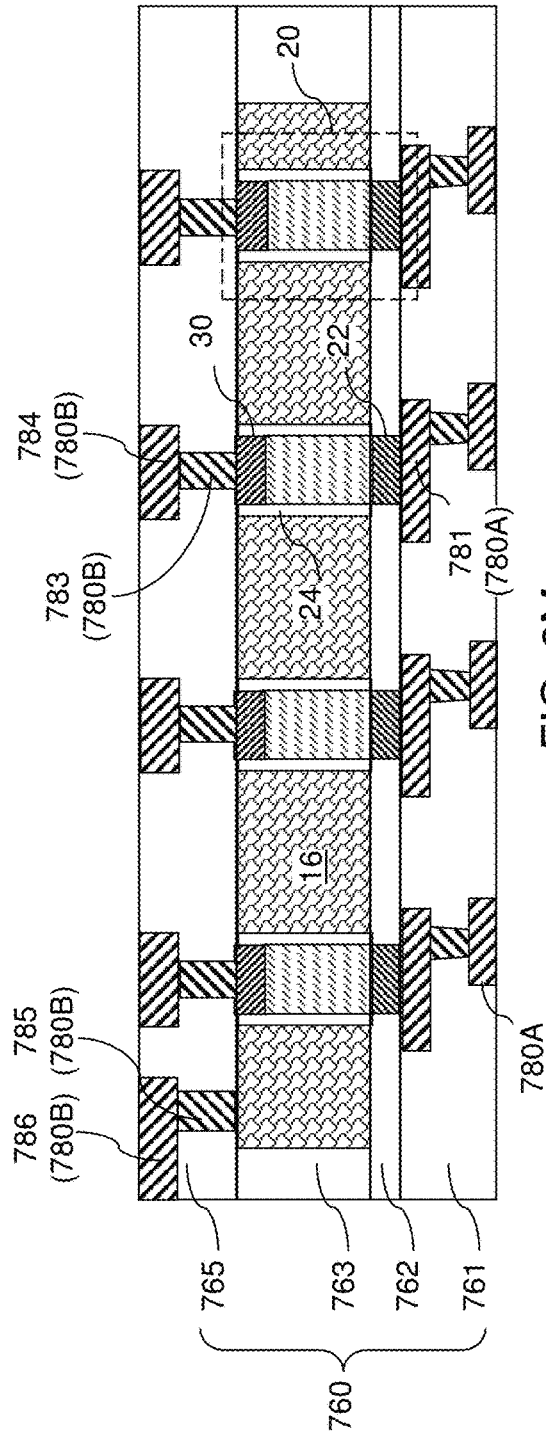

Referring to FIG. 6M, a third alternative embodiment of a set of vertical field effect transistors 20 is illustrated, which can be derived from the set of vertical field effect transistors of FIG. 6L by omitting formation of the dielectric channel cores 28.

Figure 6N:
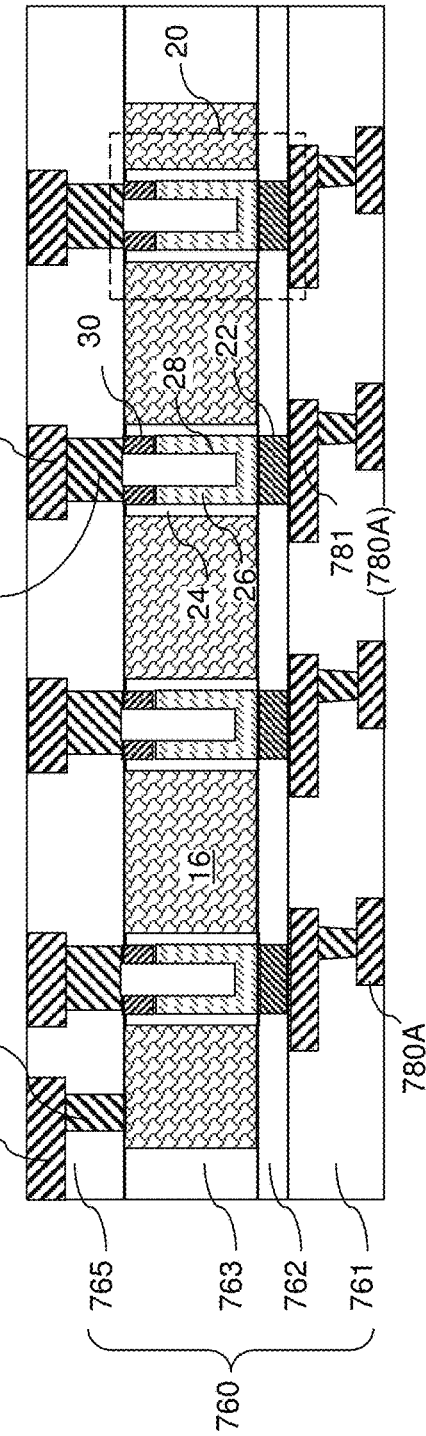

Referring to FIG. 6N, a third alternative embodiment of a set of vertical field effect transistors 20 is illustrated, which can be derived from the set of vertical field effect transistors of FIG. 6L by vertically recessing only the vertical transistor channels 26 without recessing the dielectric channel cores 28 prior to formation of the top electrodes 30 and omitting top-pad-level dielectric material layer 764.

Within each vertical field effect transistor 20, one of the bottom electrodes 22 and the top electrodes 30 comprises a source region, and another of the bottom electrodes 22 and the top electrodes 30 comprises a drain region.

Referring to FIGS. 1A-6N and according to various embodiments of the present disclosure, a bonded assembly comprising a memory die 900 and a logic die 700 is provided. The memory die 900 comprises a three-dimensional memory array. The logic die 700 comprises a logic-side substrate 708 and at least one set of vertical field effect transistors 20. Each vertical field effect transistor 20 within each set of vertical field effect transistors 20 comprises a bottom electrode 22, a vertical transistor channel 26, a gate dielectric 24 which surrounds the vertical transistor channel 26 and a top electrode 30. Each set of vertical field effect transistors 20 comprises a respective gate electrode 16 that laterally surrounds each of the gate dielectrics 24 within a same set of vertical field effect transistors 20. At least one set of vertical field effect transistors 20 is electrically connected to electrical nodes of the three-dimensional memory array through sets of metal bonding pads (988, 788) through which the memory die 900 and the logic die 700 are bonded to each other.

In one embodiment, the logic die 700 comprises substrate field effect transistors including a respective semiconductor channel 746 comprising a portion of, or comprising a same material as, the logic-side substrate 708. The bottom electrodes 22 of the at least one set of vertical field effect transistors 20 are electrically connected to a first subset of the substrate field effect transistors via a first subset of lower logic-side metal interconnect structures 780A embedded within lower logic-side dielectric material layers, which are portions of the logic-side dielectric material layers 760 located below the vertical field effect transistors 20.

In one embodiment, the bonded assembly comprises upper logic-side metal interconnect structures 780B electrically connecting the upper electrodes 30 of the at least one set of vertical field effect transistors 20 to logic-side bonding pads 788 within the sets of metal bonding pads (988, 788), and embedded within upper logic-side dielectric material layers, which are portions of the logic-side dielectric material layers 760 located above the vertical field effect transistors 20. In one embodiment, the gate electrode 16 of each set of vertical field effect transistors 20 is electrically connected to a second subset of the substrate field effect transistors via a second subset of lower logic-side metal interconnect structures 780A.

In one embodiment, the memory die 900 comprises: an alternating stack of insulating layers 32 and electrically conductive layers 46 located on a memory-side substrate 908; memory openings vertically extending through the alternating stack (32, 46); and memory opening fill structures 58 located within the memory openings and comprising a respective set of a memory film 50 and a vertical semiconductor channel 60. In one embodiment, the three-dimensional memory array comprises a three-dimensional array of memory elements that includes portions of the memory films 50 that are located adjacent to a respective one of vertical semiconductor channels 60.

In one embodiment, the memory die 900 comprises: drain regions 64 located within the memory opening fill structures 58 and contacting an end portion of a respective one of the vertical semiconductor channels 60; bit lines 98 electrically connected to a respective subset of the drain regions 63 through a respective set of drain contact via structures 88. A subset of the top electrodes 30 of the at least one set of vertical field effect transistors 20 is electrically connected to a respective one of the bit lines 98.

In one embodiment, the at least one set of vertical field effect transistors 20 comprise: a first set of vertical field effect transistors 20A including a respective bottom electrode 22 that is electrically connected to a respective sense amplifier circuit located on the logic-side substrate 708; and a second set of vertical field effect transistors 20B including a respective bottom electrode 22 that is electrically connected to a bit line bias circuit located on the logic-side substrate 708. In one embodiment, the logic die 700 comprises upper logic-side metal interconnect structures 780B located between the at least one set of vertical field effect transistors 20 and the sets of metal bonding pads 788; and the upper logic-side metal interconnect structures 780B comprises upper-electrode-connection metal lines 784 that are electrically connected to a respective set of a top electrode 30 within the first set of vertical field effect transistors 20A and a top electrode 30 within the second set of vertical field effect transistors 20B.

In one embodiment, at least 50% of a total area of the at least one set of vertical field effect transistors 20 has an areal overlap with a total area including each sense amplifier circuit and each bit line bias circuit in a plan view. In one embodiment, at least 90% of a total area of the at least one set of vertical field effect transistors 20 has an areal overlap with a total area including each sense amplifier circuit and each bit line bias circuit in a plan view. In one embodiment, 100% of a total area of the at least one set of vertical field effect transistors 20 has an areal overlap with a total area including each sense amplifier circuit and each bit line bias circuit in a plan view. In one embodiment, at least 50% of a total area of the at least one set of vertical field effect transistors 20 is located outside a total area including each sense amplifier circuit and each bit line bias circuit in a plan view. In one embodiment, at least 90% of a total area of the at least one set of vertical field effect transistors 20 is located outside a total area including each sense amplifier circuit and each bit line bias circuit in a plan view. In one embodiment, 100% of a total area of the at least one set of vertical field effect transistors 20 is located outside a total area including each sense amplifier circuit and each bit line bias circuit in a plan view.

In one embodiment, the electrically conductive layers 46 comprise word lines of the three-dimensional memory array. The memory die 900 comprises layer contact via structures 86 extending vertically through a dielectric material portion 65 and contacting a surface of a respective one of the electrically conductive layers 46. A subset of the top electrodes 30 of the at least one set of vertical field effect transistors 20 is electrically connected to a respective one of the word lines.

In one embodiment, each bottom electrode 22 of the at least one set of vertical field effect transistors 20 contacts a top surface of a respective lower logic-side metal interconnect structure 780A within the logic die 700. Each top electrode 30 of the at least one set of vertical field effect transistors 20 contacts a bottom surface of a respective upper logic-side metal interconnect structure 780B within the logic die 700.

Figure 7A:
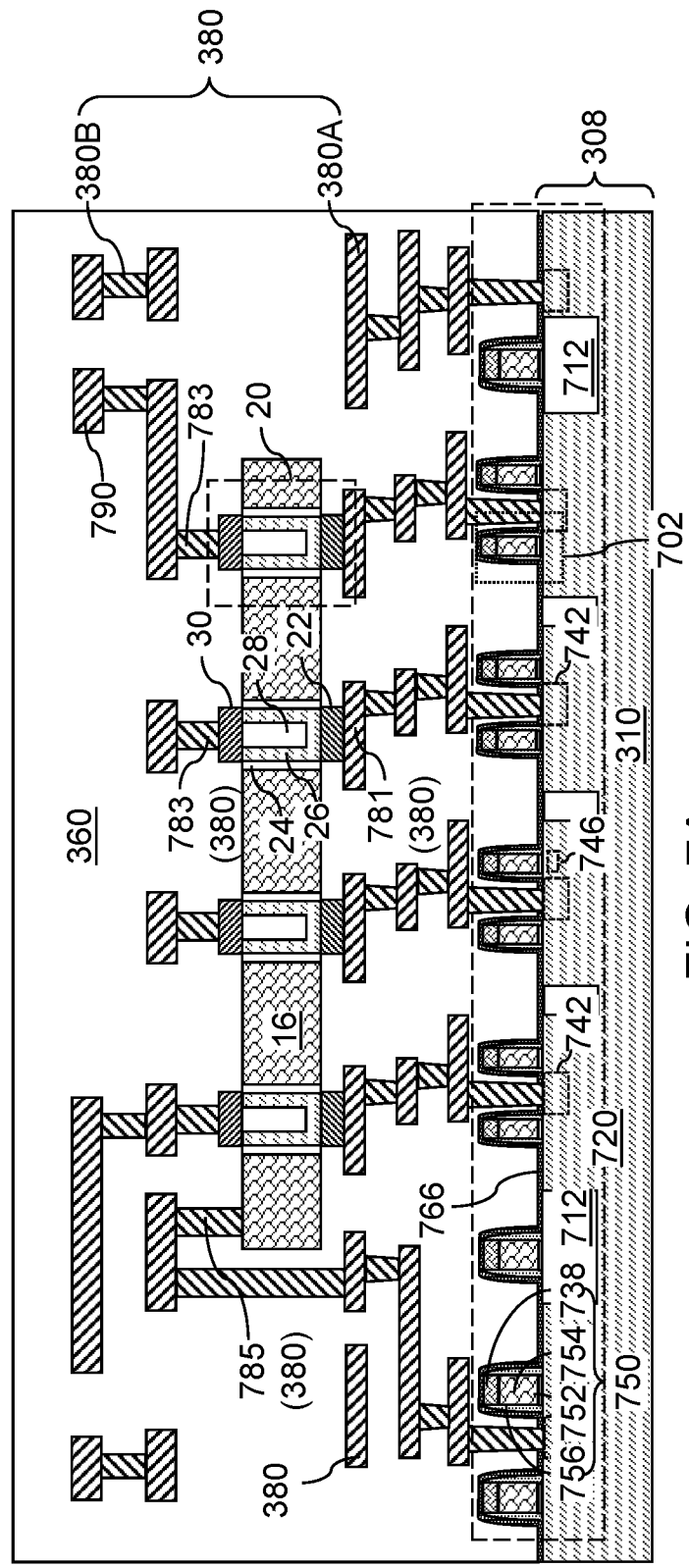
FIG. 7A is a first vertical cross-sectional view of an exemplary semiconductor die after formation of lower-level dielectric material layers embedding lower-level metal interconnect structures according to a second embodiment of the present disclosure.
Figure 7B:
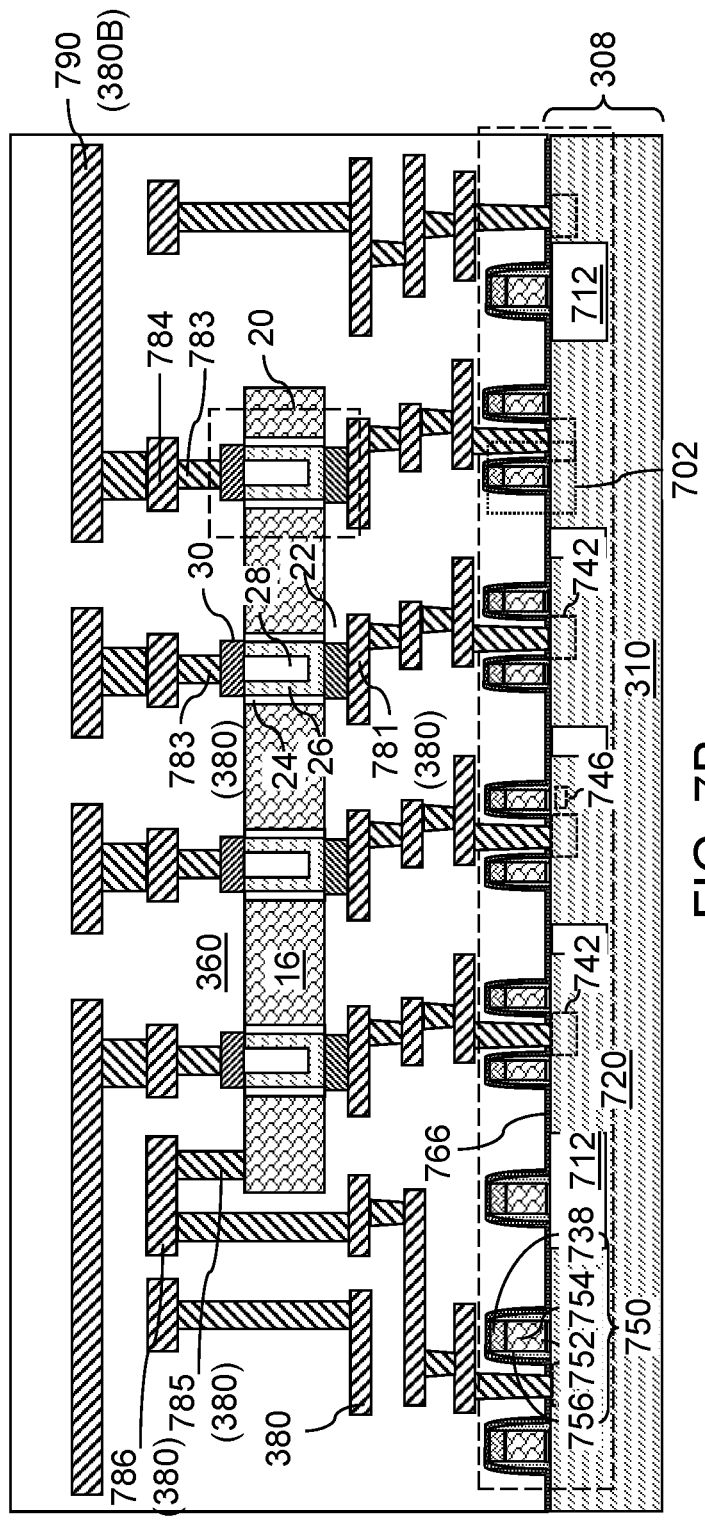
FIG. 7B is a second vertical cross-sectional view of the exemplary semiconductor die of FIG. 7A.

Referring to FIGS. 7A and 7B, a second exemplary structure is illustrated, which comprises an exemplary semiconductor die after formation of lower-level dielectric material layers 360 embedding lower-level metal interconnect structures according to a second embodiment of the present disclosure. The second exemplary structure comprises a semiconductor substrate 308 including a substrate semiconductor layer 310. In one embodiment, the semiconductor substrate 308 may be the same as the logic-side substrate 708, and the substrate semiconductor layer 310 may be the same as the logic-side substrate semiconductor layer 710. A peripheral circuit for controlling operation of a three-dimensional memory array can be formed on the substrate semiconductor layer 310. The peripheral circuit of the second exemplary structure may be the same as the peripheral circuit formed on the logic-side substrate semiconductor layer 710 described above. The peripheral circuit can include substrate field effect transistors 702, which include a respective semiconductor channel comprising a portion of, or comprising a same material as, the semiconductor substrate 308. First metal interconnect structures 380A embedded within first dielectric material layers can be formed. The first metal interconnect structures 380A can be electrically connected to a respective node of the peripheral circuit on the semiconductor substrate 308.

At least one set of vertical field effect transistors can be formed by performing the processing steps of FIGS. 6A-6J and/or FIGS. 6K to 6N. The bottom electrodes 22 of the at least one set of vertical field effect transistors 20 can be electrically connected to a first subset of the substrate field effect transistors via a first subset of first metal interconnect structures 380A. Generally, the bottom electrodes 22 can be formed over first dielectric material layers (which are a subset of lower-level dielectric material layers 360) that overlie the semiconductor substrate 308. For each set of vertical field effect transistors 20, a gate electrode 16 including a plurality of vertically-extending openings (channel cavities) can be formed over the bottom electrodes 22 so that the bottom electrodes 22 are exposed underneath the vertically-extending openings. A combination of a cylindrical gate dielectric 24 and a vertical transistor channel 26 can be formed within each of the vertically-extending openings. Top electrodes 30 can be formed on the vertical transistor channels 26. Second metal interconnect structures 380B embedded in second dielectric material layers (i.e., portions of the lower-level dielectric material layers 360 overlying the vertical field effect transistors 20) can be formed over the top electrodes 30. The second metal interconnect structures 380B can include, for example, upper electrode contact via structures 783 that contact a respective one of the top electrodes 30, upper-electrode-connection metal lines 784 that contact at least one of the upper electrode contact via structures 783, gate contact via structures 785 that contact a respective one of the gate electrodes 16, and gate-connection metal lines 786 that contact a top surface of a respective gate contact via structure 785 and located at the same level as the upper-electrode-connection metal lines 784. The second metal interconnect structures 380B can include metallic landing pad structures 790 which can be subsequently employed as contact pad for metallic connection via structures to be subsequently formed. A topmost surface of the lower-level dielectric material layers 360 can include a planar dielectric surface.

Figure 8A:
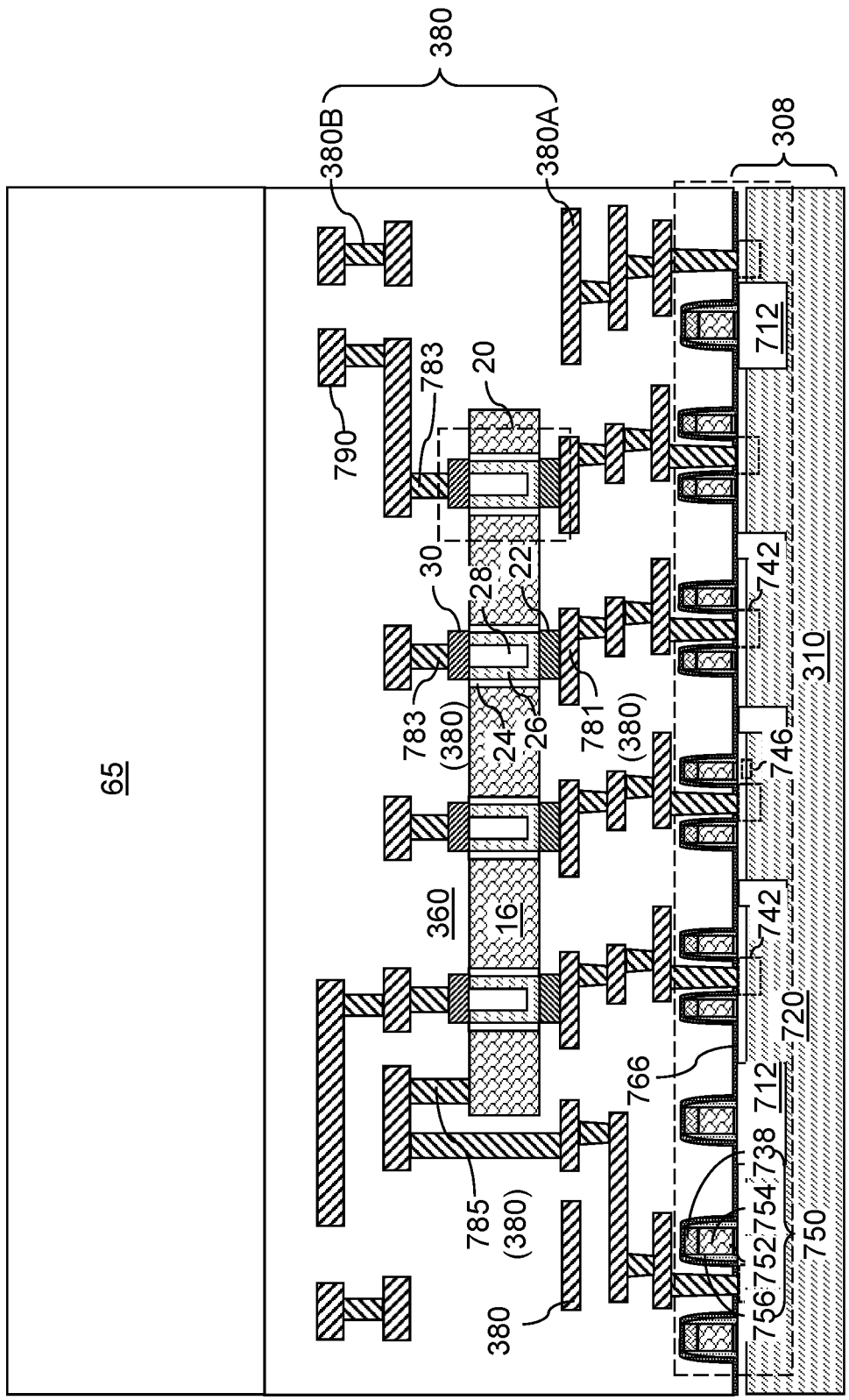
FIG. 8A is a first vertical cross-sectional view of the exemplary semiconductor die after formation of alternating stacks of insulating layers and electrically conductive layers and memory opening fill structures according to a second embodiment of the present disclosure.
Figure 8B:
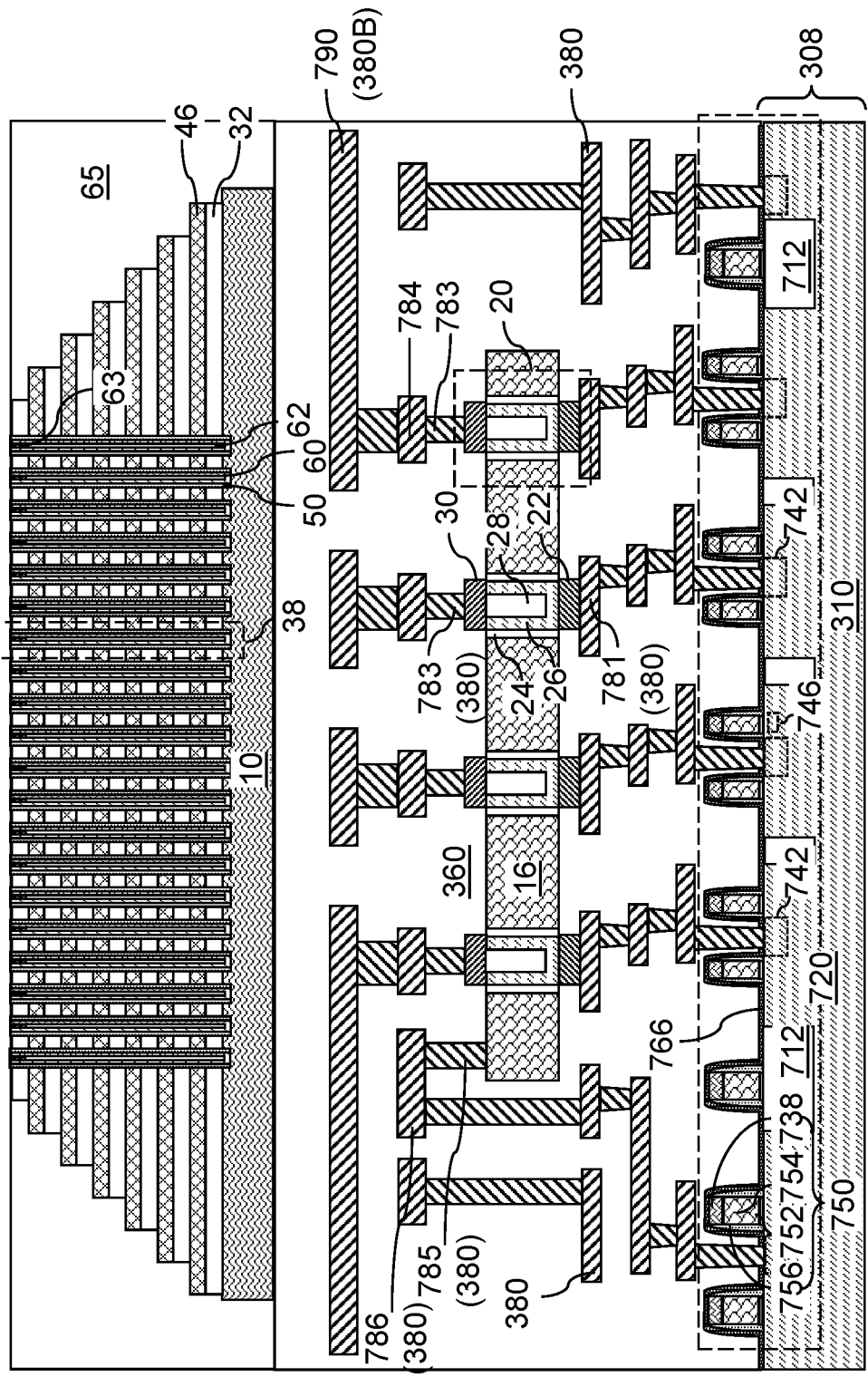
FIG. 8B is a second vertical cross-sectional view of the exemplary semiconductor die of FIG. 8A.

Referring to FIGS. 8A and 8B, a semiconductor material layer 10 can be formed over the lower-level dielectric material layers 360 by depositing a polycrystalline semiconductor material (e.g., polysilicon), or by bonding and patterning a single crystalline semiconductor material (e.g., single crystal silicon) layer employing a layer transfer method. A three-dimensional memory array can be formed in the same manner as the three-dimensional memory array illustrated in FIGS. 2A-2D. The semiconductor material layer 10 can be employed in lieu of the memory-side substrate semiconductor layer 910.

Generally, an alternating stack of insulating layers 32 and spacer material layers can be formed over a semiconductor substrate 308. The spacer material layers are formed as, or are subsequently replaced with, electrically conductive layers 46. Dielectric material portion 65 are formed adjacent to the alternating stack (32, 46). Memory openings are formed through the alternating stack (32, 46), and memory opening fill structures 58 can be formed within the memory openings. Each of the memory opening fill structures 58 comprises a respective set of a memory film 50 and a vertical semiconductor channel 60. Drain regions 63 can be formed at an end portion of a respective one of the vertical semiconductor channels 60. A three-dimensional memory array can be formed over the second dielectric material layers, which are upper portions of the lower-level dielectric material layers 360. The electrically conductive layers comprise word lines of the three-dimensional memory array.

Figure 9A:
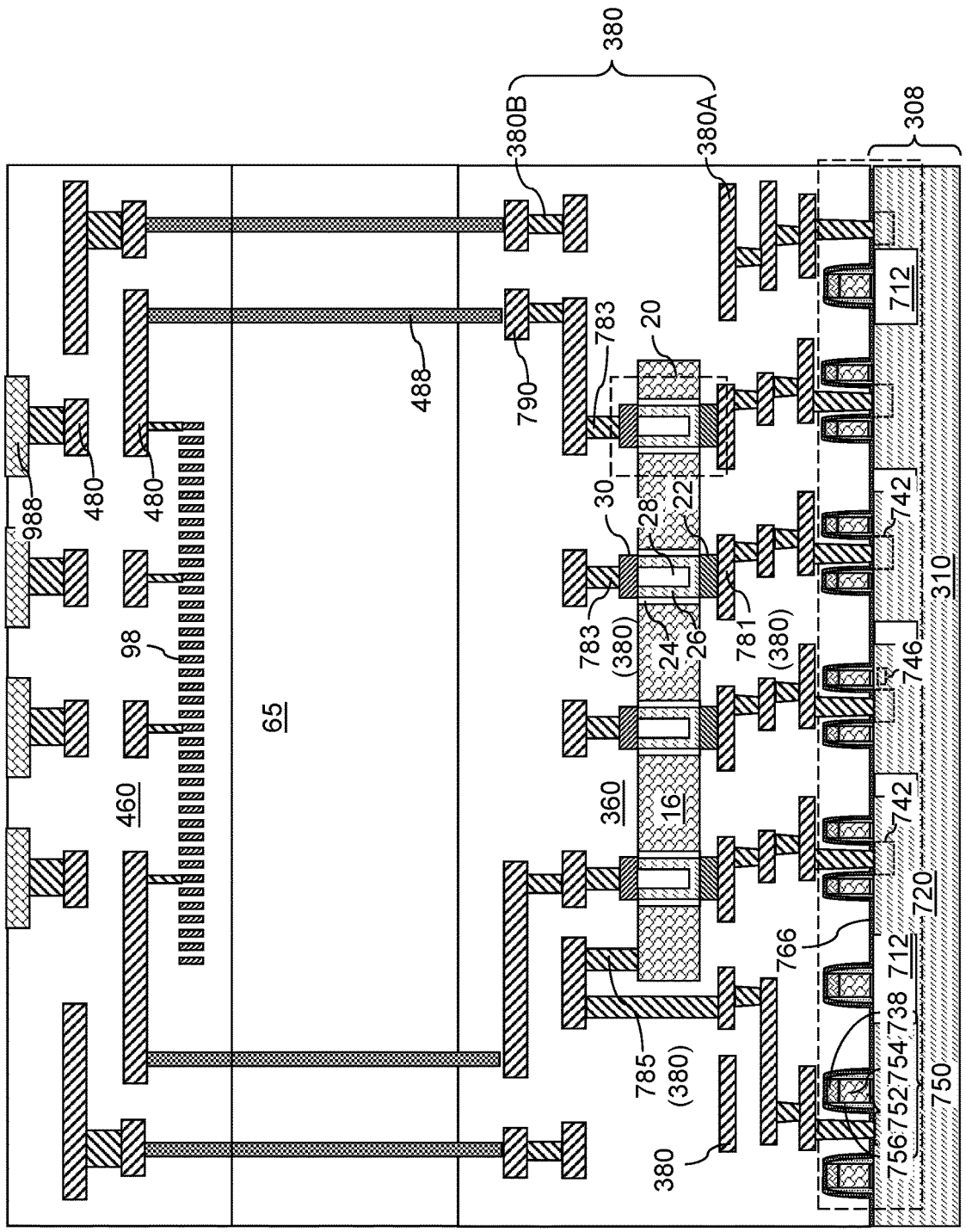
FIG. 9A is a first vertical cross-sectional view of the exemplary semiconductor die after formation of upper-level dielectric material layers embedding upper-level metal interconnect structures according to a second embodiment of the present disclosure.
Figure 9B:
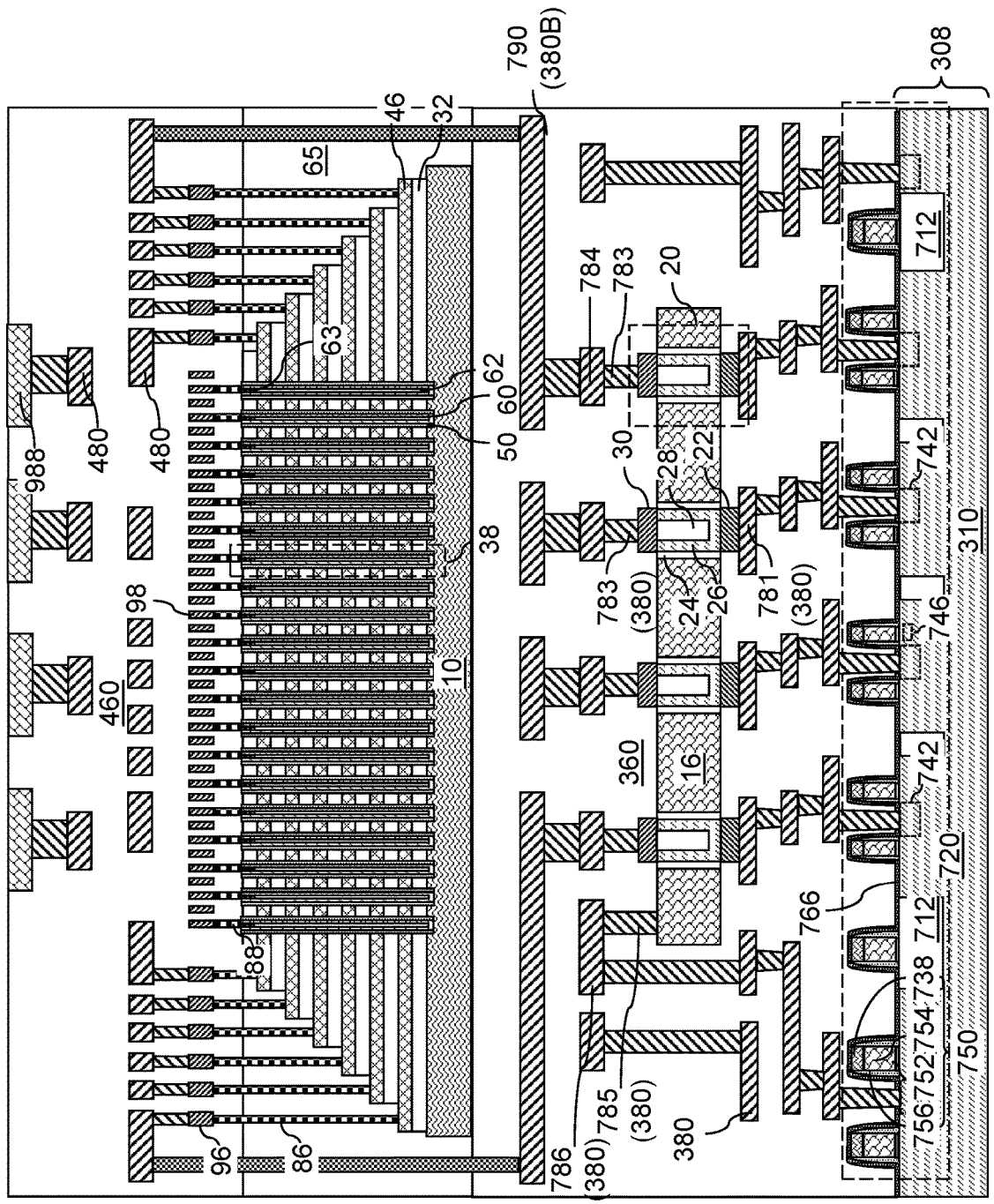
FIG. 9B is a second vertical cross-sectional view of the exemplary semiconductor die of FIG. 9A.

Referring to FIGS. 9A and 9B, layer contact via structures 86 can be formed directly on a surface of a respective one of the electrically conductive layers 46. Memory-level connection via structures 488 can be formed through the dielectric material portions 65 onto a top surface of respective one of the metallic landing pad structures 790. Upper-level metal interconnect structures 480 embedded in upper-level dielectric material layers 460 can be formed over the alternating stack (32, 46). The upper-level metal interconnect structures 480, the memory-level connection via structures 488, and the second metal interconnect structures 380B electrically connect the upper electrodes 30 of the at least one set of vertical field effect transistors 20 to electrical nodes of the three-dimensional memory array. The upper-level metal interconnect structures 480 can include bit lines 98 that are formed over the memory opening fill structures 58. Each of the bit lines 98 can be electrically connected to a respective subset of the drain regions 63 through a respective set of drain contact via structures 88. Electrical nodes of the three-dimensional memory array can be electrically connected to a respective one of the top electrodes 30. In one embodiment, a subset of the top electrodes 30 of the at least one set of vertical field effect transistors 20 can be electrically connected to a respective one of the bit lines 98. In one embodiment, a subset of the top electrodes 30 of the at least one set of vertical field effect transistors 20 can be electrically connected to a respective one of the word lines.

Figure 10:
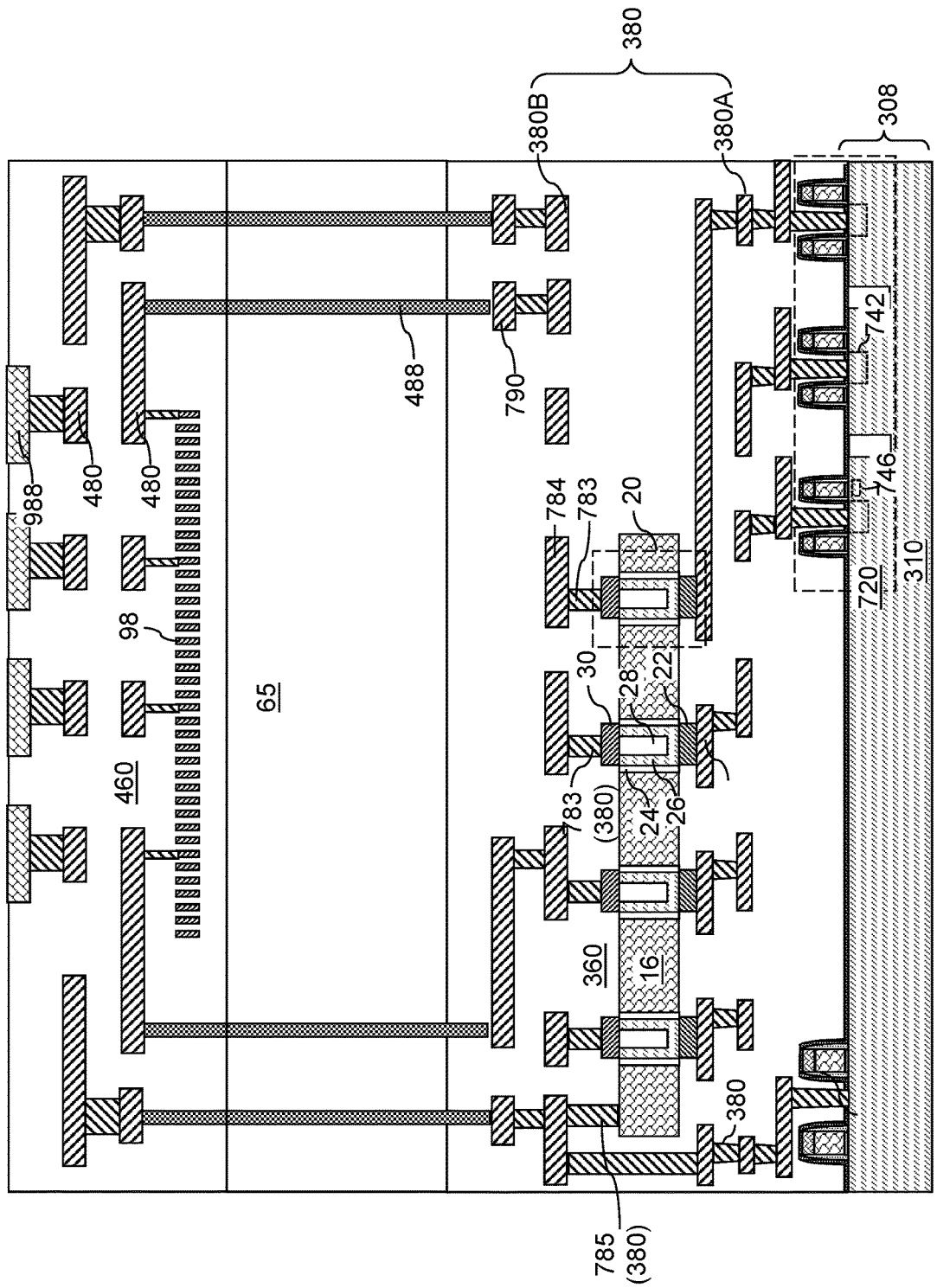
FIG. 10 is a vertical cross-sectional view of an alternative embodiment of the exemplary semiconductor structure according to the second embodiment of the present disclosure.

Referring to FIG. 10, an alternative embodiment of the second exemplary structure is illustrated, which can be derived from the second exemplary structure of FIGS. 9A and 9B by rearranging the layout of the substrate field effect transistors such that the areas of the vertical field effect transistors 20 is laterally offset, at least partially, from the area of the sense amplifier circuits and the bit line bias circuits. Generally, the percentage overlap between the total area of the at least one set of vertical field effect transistors 20 and the total area including each sense amplifier circuit and each bit line bias circuit may be from 0% to 100% of the lesser of the total area of the at least one set of vertical field effect transistors 20 and the total area including each sense amplifier circuit and each bit line bias circuit.

Referring to FIGS. 6A-10 and according to various embodiments of the present disclosure, a semiconductor structure is provided, which comprises: at least one set of vertical field effect transistors 20 located above, and vertically spaced from, a semiconductor substrate 308, wherein each vertical field effect transistor 20 within each set of vertical field effect transistors 20 comprises a bottom electrode 22, a vertical transistor channel 26, a gate dielectric 24 which surrounds the vertical transistor channel 26, and a top electrode 30; and a three-dimensional NAND memory array located over the at least one set of vertical field effect transistors, wherein electrical nodes of the three-dimensional NAND memory array are electrically connected to a respective one of the at least one set of vertical field effect transistors 20.

In one embodiment, the three-dimensional NAND memory array comprises: an alternating stack of insulating layers 32 and electrically conductive layers 46 located over the at least one set of vertical field effect transistors 20; memory openings vertically extending through the alternating stack (32, 46); and memory opening fill structures 58 located within the memory openings and comprising a respective set of a memory film 50 and a vertical semiconductor channel 60. In one embodiment, a semiconductor material layer 10 can be located between the alternating stack (32, 46) and the at least one set of vertical field effect transistors 20. The semiconductor material layer 10 may comprise at least one of a horizontal semiconductor channel and a source region 61.

Metal interconnect structures (480, 488, 280) can electrically connect the electrical nodes of the three-dimensional NAND memory array to the respective one of the at least one set of vertical field effect transistors 20. The metal interconnect structures (480, 488, 280) cam comprise: lower-level metal interconnect structures 380 underlying the alternating stack (32, 46); upper-level metal interconnect structures 480 overlying the alternating stack (32, 46); and memory-level connection via structures 488 vertically extending between a horizontal plane including a top surface of the alternating stack (32, 46) and a horizontal plane including a bottom surface of the alternating stack (32, 46) and connecting the lower-level metal interconnect structures 380 to the upper-level metal interconnect structures 480.

In one embodiment, the three-dimensional NAND memory array comprises a three-dimensional NAND array of memory elements that includes portions of the memory films 50 that are located adjacent to a respective one of vertical semiconductor channels 60.

In one embodiment, the semiconductor structure comprises: drain regions 63 located within the memory opening fill structures 58 and contacting an end portion of a respective one of the vertical semiconductor channels 60; bit lines 98 electrically connected to a respective subset of the drain regions 63 through a respective set of drain contact via structures 88, wherein a subset of the top electrodes 30 of the at least one set of vertical field effect transistors 20 is electrically connected to a respective one of the bit lines 98. In one embodiment, the at least one set of vertical field effect transistors 20 comprises: a first set of vertical field effect transistors 20 including a respective bottom electrode 22 that is electrically connected to a respective sense amplifier circuit located on the semiconductor substrate 308; and a second set of vertical field effect transistors 20 including a respective bottom electrode 22 that is electrically connected to a bit line bias circuit located on the semiconductor substrate 308.

In one embodiment, upper-electrode-connection metal lines 784 can be located between the alternating stack (32, 46) and the at least one set of vertical field effect transistors 20, wherein each of the upper-electrode-connection metal lines 784 is electrically connected to a respective set of a top electrode 30 within the first set of vertical field effect transistors 20 and a top electrode 30 within the second set of vertical field effect transistors 20.

In one embodiment, at least 50% of a total area of the at least one set of vertical field effect transistors 20 has an areal overlap with a total area including each sense amplifier circuit and each bit line bias circuit in a plan view. In one embodiment, at least 90% of a total area of the at least one set of vertical field effect transistors 20 has an areal overlap with a total area including each sense amplifier circuit and each bit line bias circuit in a plan view. In one embodiment, 100% of a total area of the at least one set of vertical field effect transistors 20 has an areal overlap with a total area including each sense amplifier circuit and each bit line bias circuit in a plan view. In one embodiment, at least 50% of a total area of the at least one set of vertical field effect transistors 20 is located outside a total area including each sense amplifier circuit and each bit line bias circuit in a plan view. In one embodiment, at least 90% of a total area of the at least one set of vertical field effect transistors 20 is located outside a total area including each sense amplifier circuit and each bit line bias circuit in a plan view. In one embodiment, 100% of a total area of the at least one set of vertical field effect transistors 20 is located outside a total area including each sense amplifier circuit and each bit line bias circuit in a plan view.

In one embodiment, the electrically conductive layers 46 comprise word lines of the three-dimensional NAND memory array; contact via structures 86 extend vertically through a dielectric material portion 65 and contact a surface of a respective one of the electrically conductive layers 46; and a subset of the top electrodes 30 of the at least one set of vertical field effect transistors 20 is electrically connected to a respective one of the word lines.

In one embodiment, each set of vertical field effect transistors 20 comprises a respective gate electrode 16 that laterally surrounds each of the gate dielectrics 24 within a same set of vertical field effect transistors 20.

In one embodiment, the semiconductor structure comprises substrate field effect transistors including a respective semiconductor channel comprising a portion of, or comprising a same material as, the semiconductor substrate 308, wherein the bottom electrodes 22 of the at least one set of vertical field effect transistors 20 are electrically connected to a first subset of the substrate field effect transistors via a first subset of first metal interconnect structures 380A embedded within first dielectric material layers 360 that underlie the at least one set of vertical field effect transistors 20.

In one embodiment, the gate electrode 16 of each set of vertical field effect transistors 20 is electrically connected to a second subset of the substrate field effect transistors via a second subset of the first metal interconnect structures 380A.

FIGS. 11A-16B illustrate a sequence of processing steps that can be employed to form a three-dimensional NAND memory array within the memory die 900 of the first exemplary structure or within the second exemplary structure. In the case of the second exemplary structure, the memory-side substrate semiconductor layer 910 can be replaced with a semiconductor material layer 10.

Figure 11A:
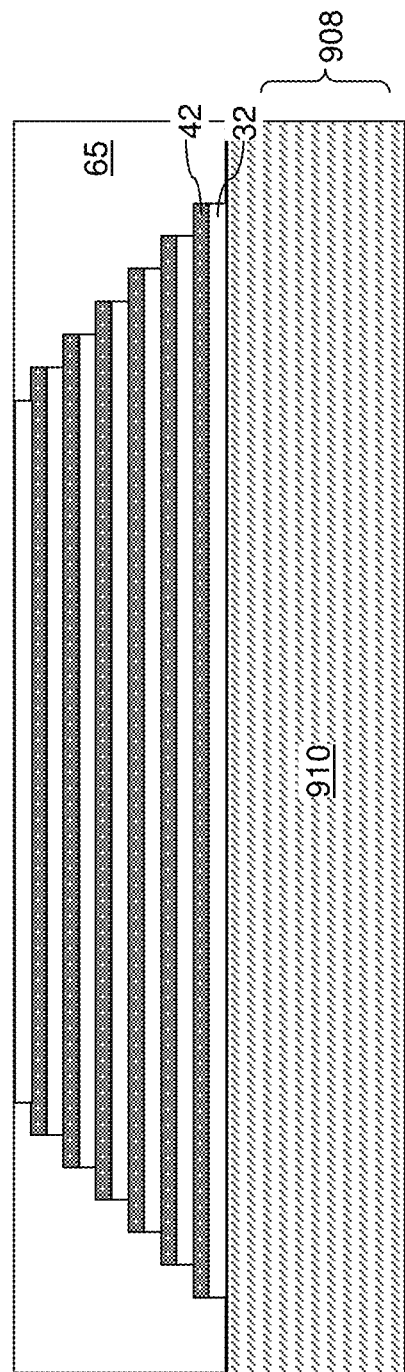
FIG. 11A is a first vertical cross-sectional view of a first portion of the exemplary memory die after formation of an alternating stack of insulating layers and sacrificial material layers and dielectric material portions according to an embodiment of the present disclosure.
Figure 11B:
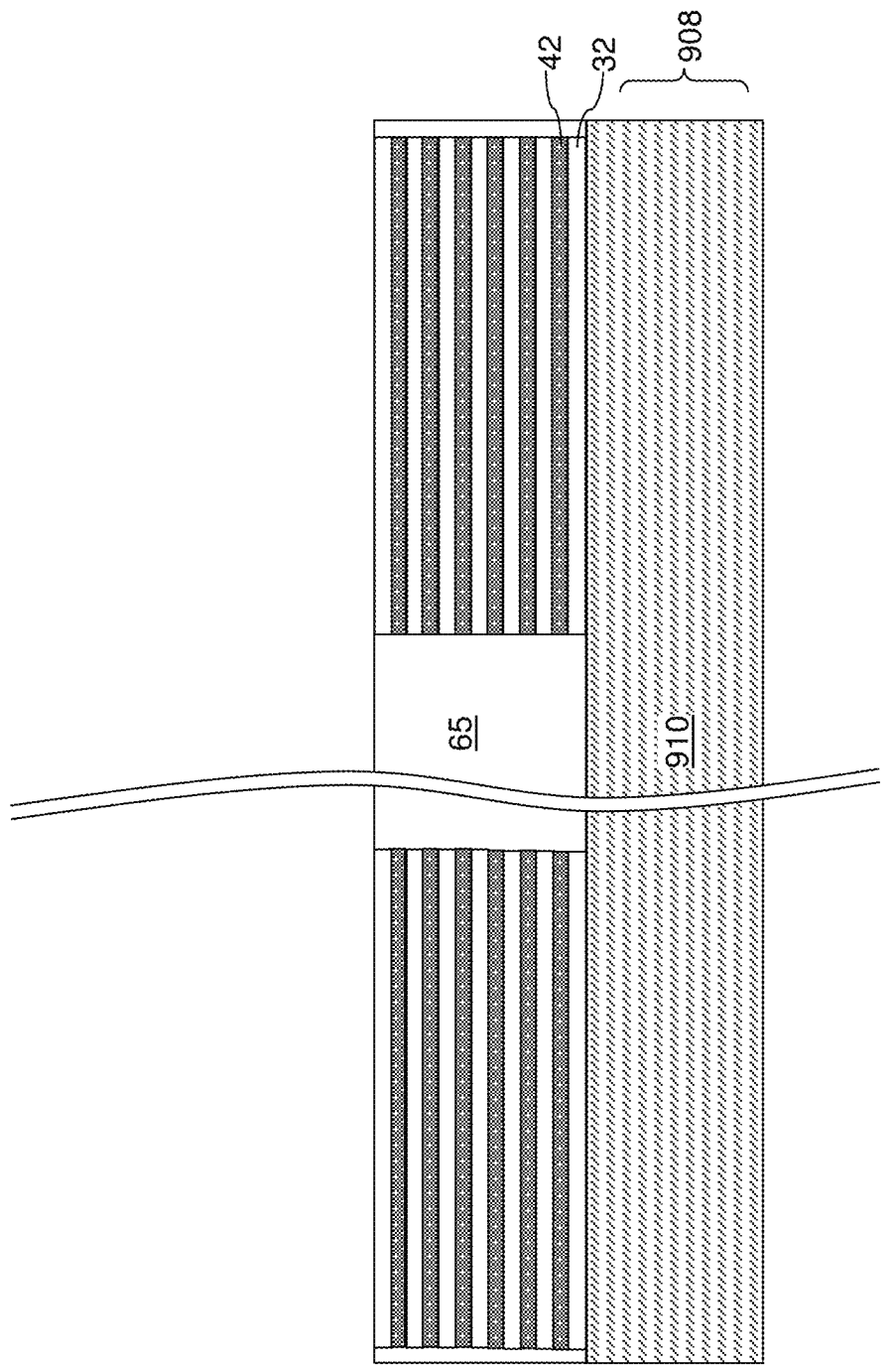
FIG. 11B is a second vertical cross-sectional view of a second portion of the exemplary memory die at the processing step of FIG. 11A.

Referring to FIGS. 11A and 11B, at least one alternating stack of insulating layers 32 and spacer material layers can be formed over the memory-side substrate semiconductor layer 910 or over the semiconductor material layer 10. The spacer material layers are formed are, or are subsequently replaced with, electrically conductive layers 46, which function as word lines. In the illustrated example, the spacer material layers may be formed as sacrificial material layers 42. Each alternating stack (32, 42) can be patterned to form stepped surfaces. The area including the stepped surfaces constitute the staircase region 200. Dielectric material portions 65 can be formed over the stepped surfaces. Further, additional dielectric material portions 65 can be formed between alternating stacks (32, 46) that are laterally spaced apart.

Figure 12A:
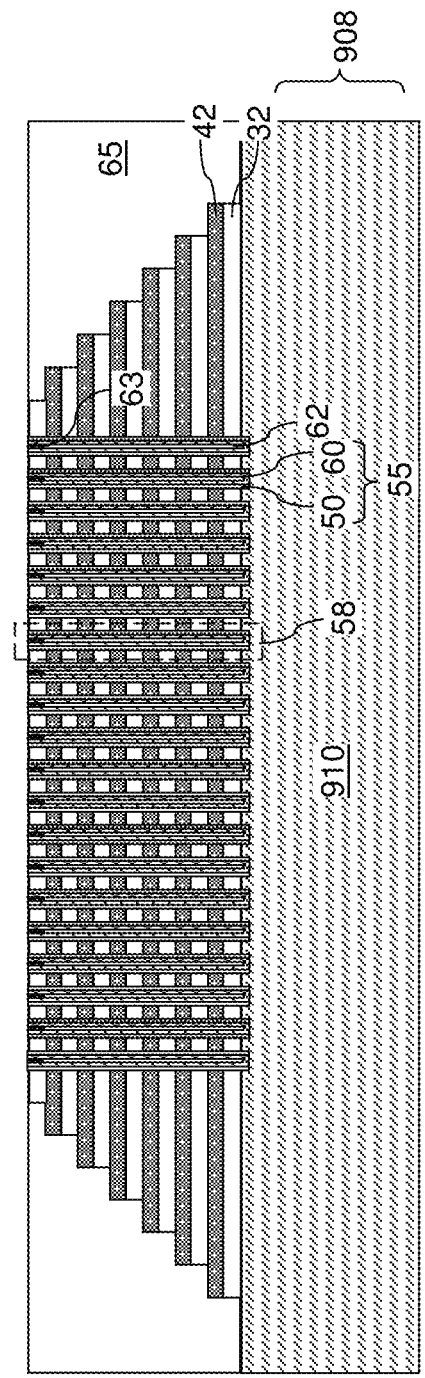
FIG. 12A is a first vertical cross-sectional view of a first portion of the exemplary memory die after formation of memory opening fill structures according to an embodiment of the present disclosure.
Figure 12B:
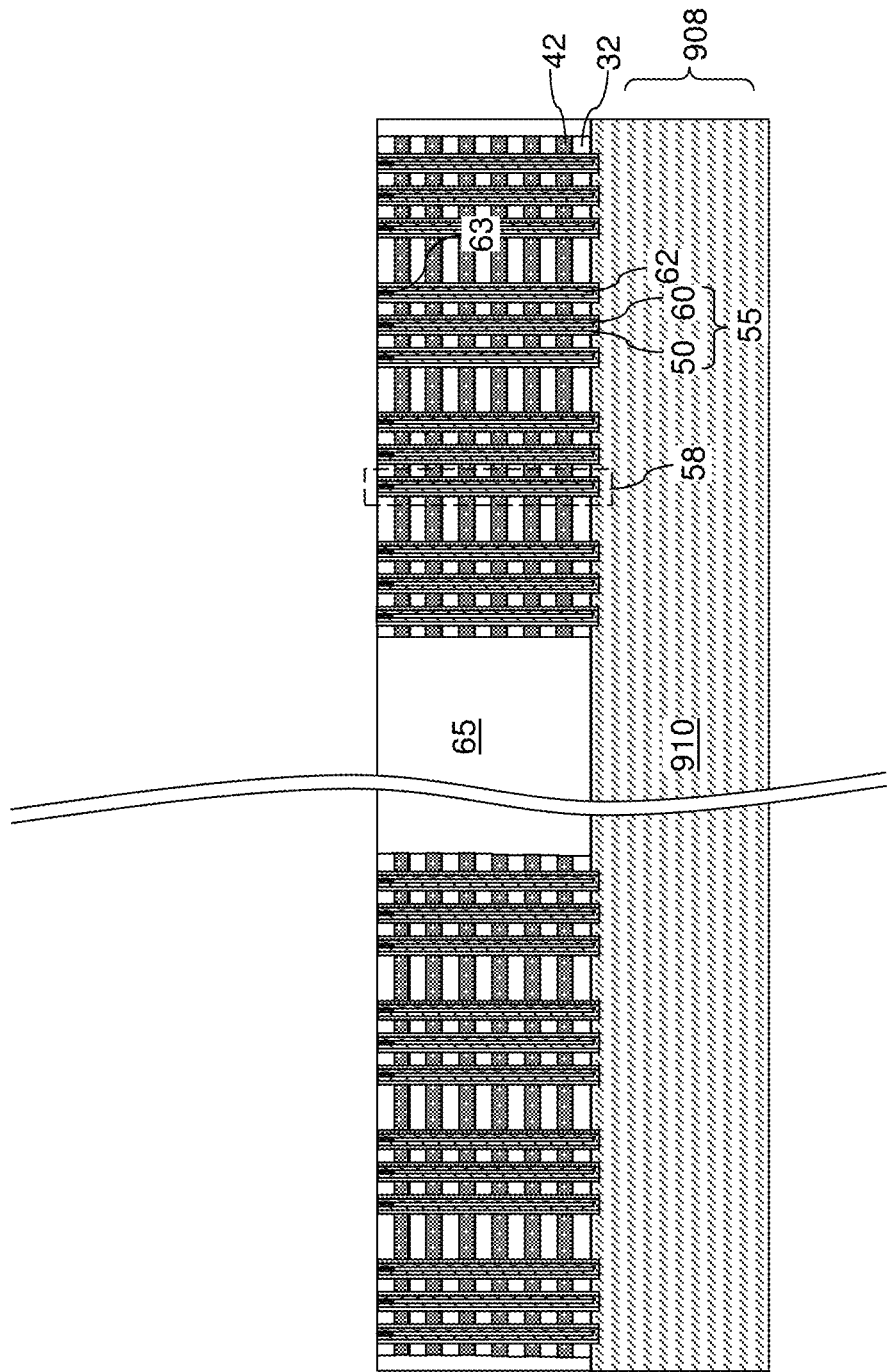
FIG. 12B is a second vertical cross-sectional view of a second portion of the exemplary memory die at the processing step of FIG. 12A.

Referring to FIGS. 12A and 12B, memory openings are formed through the portions of the alternating stack (32, 42) in which each layer of the alternating stack (32, 42) is present, i.e., within a memory array region 100. Memory opening fill structures 58 are formed within the memory openings. Each of the memory opening fill structures comprises a respective set of a memory film 50, a vertical semiconductor channel 60, and a drain region 63, and optionally includes a dielectric core 62. Each contiguous combination of a vertical semiconductor channel 60 and a memory film 50 constitutes a memory stack structure 55. Each memory film 50 includes a vertical stack of memory elements that are located at levels of the electrically conductive layers 46. In one embodiment, each memory film 50 may include a layer stack including, from outside to inside, a blocking dielectric layer, a charge storage layer or a vertical stack of discrete charge storage material portions, and a tunneling dielectric layer. Portions of the charge storage layer located at levels of the electrically conductive layers, or the vertical stack of discrete charge storage material portions constitute a vertical stack of memory elements. The drain regions 63 are formed at a top end portion of a respective one of the vertical semiconductor channels 60.

Figure 13A:
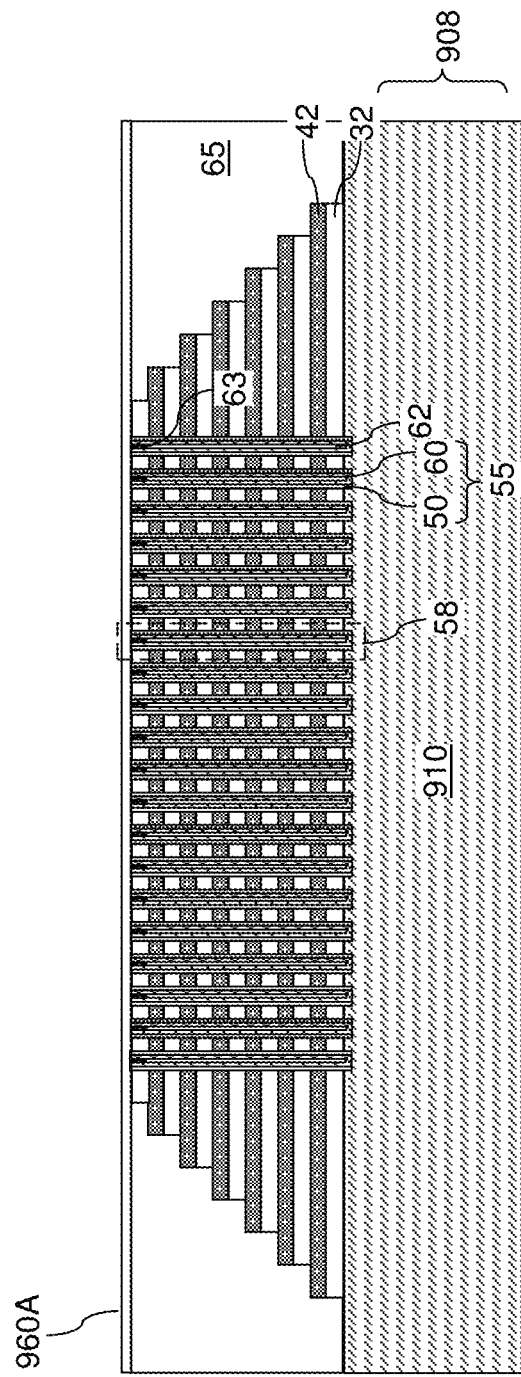
FIG. 13A is a first vertical cross-sectional view of a first portion of the exemplary memory die after formation of backside trenches according to an embodiment of the present disclosure.
Figure 13B:
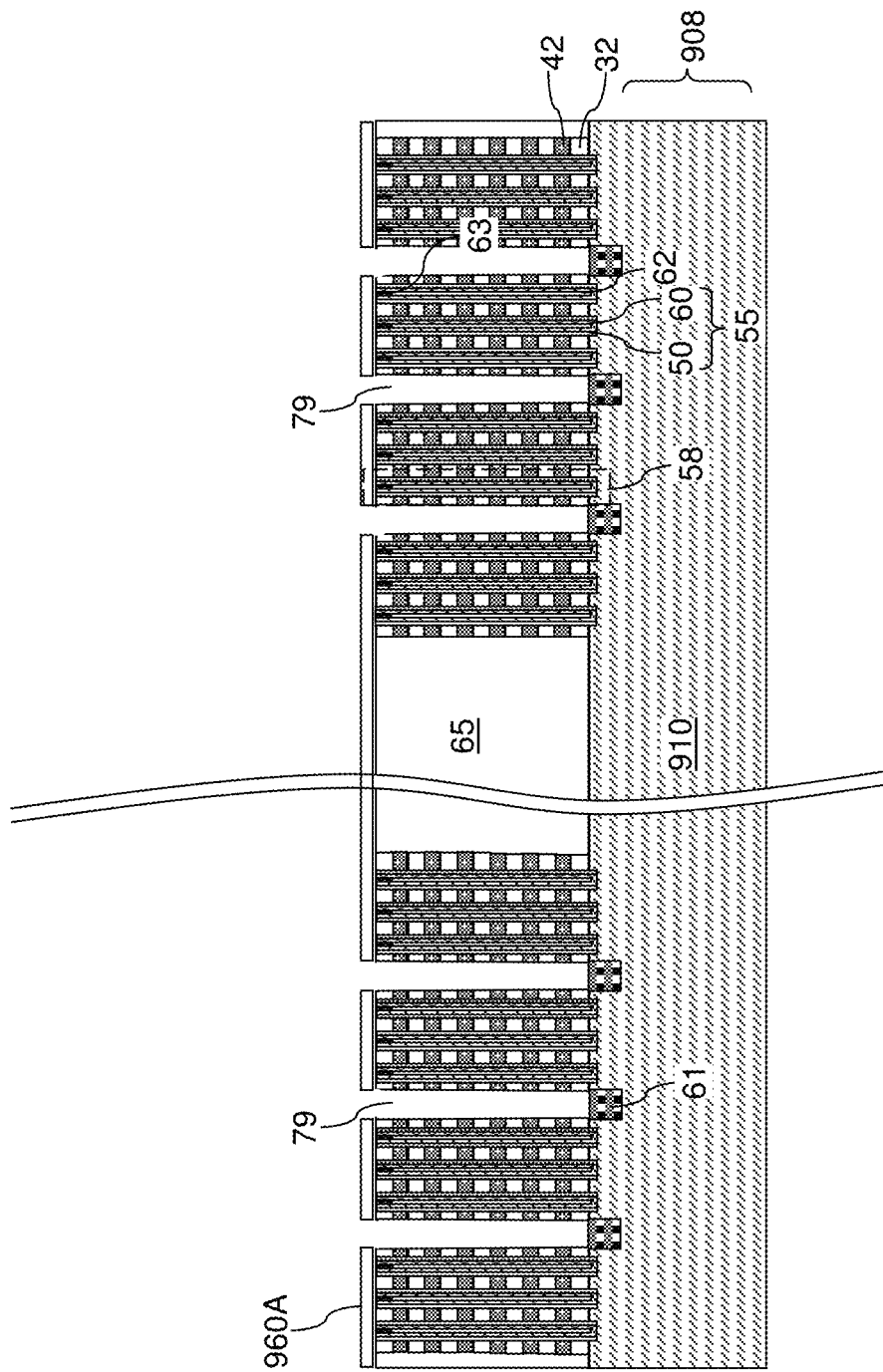
FIG. 13B is a second vertical cross-sectional view of a second portion of the exemplary memory die at the processing step of FIG. 13A.

Referring to FIGS. 13A and 13B, an insulating cap layer 960A can be formed over the alternating stack (32, 42), and backside trenches 79 laterally extending along a first horizontal direction can be formed though the alternating stacks (32, 42) such that each alternating stack (32, 42) is divided into a respective plurality of alternating stacks (32, 42) by the backside trenches 79. Source regions 61 can be formed at the bottom of each backside trench 79.

Figure 14A:
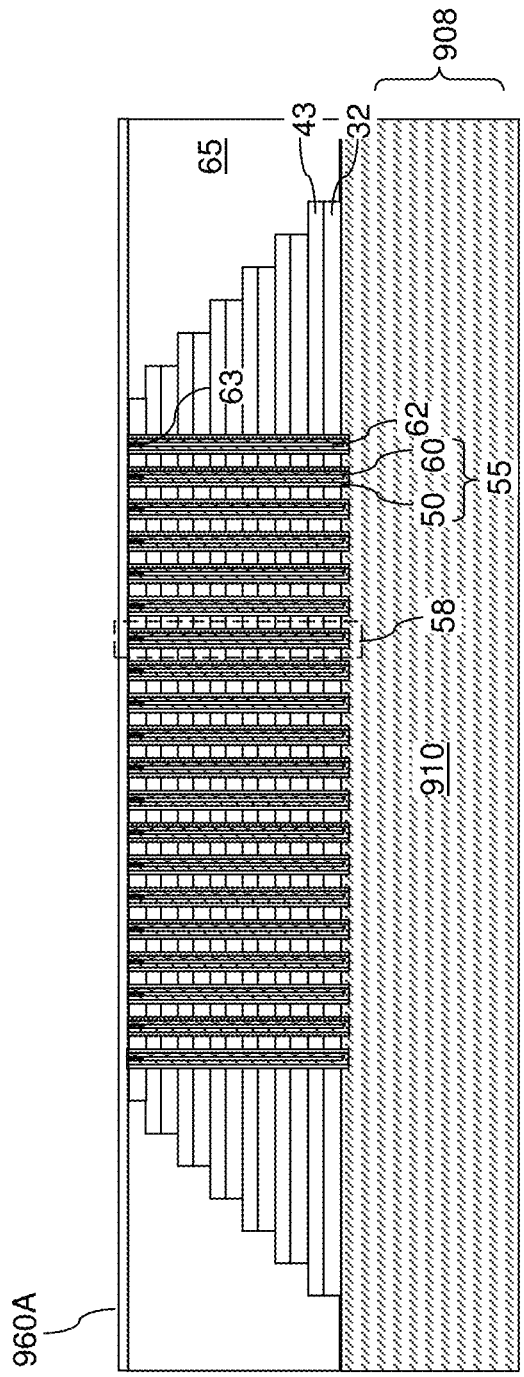
FIG. 14A is a first vertical cross-sectional view of a first portion of the exemplary memory die after formation of backside recesses according to an embodiment of the present disclosure.
Figure 14B:
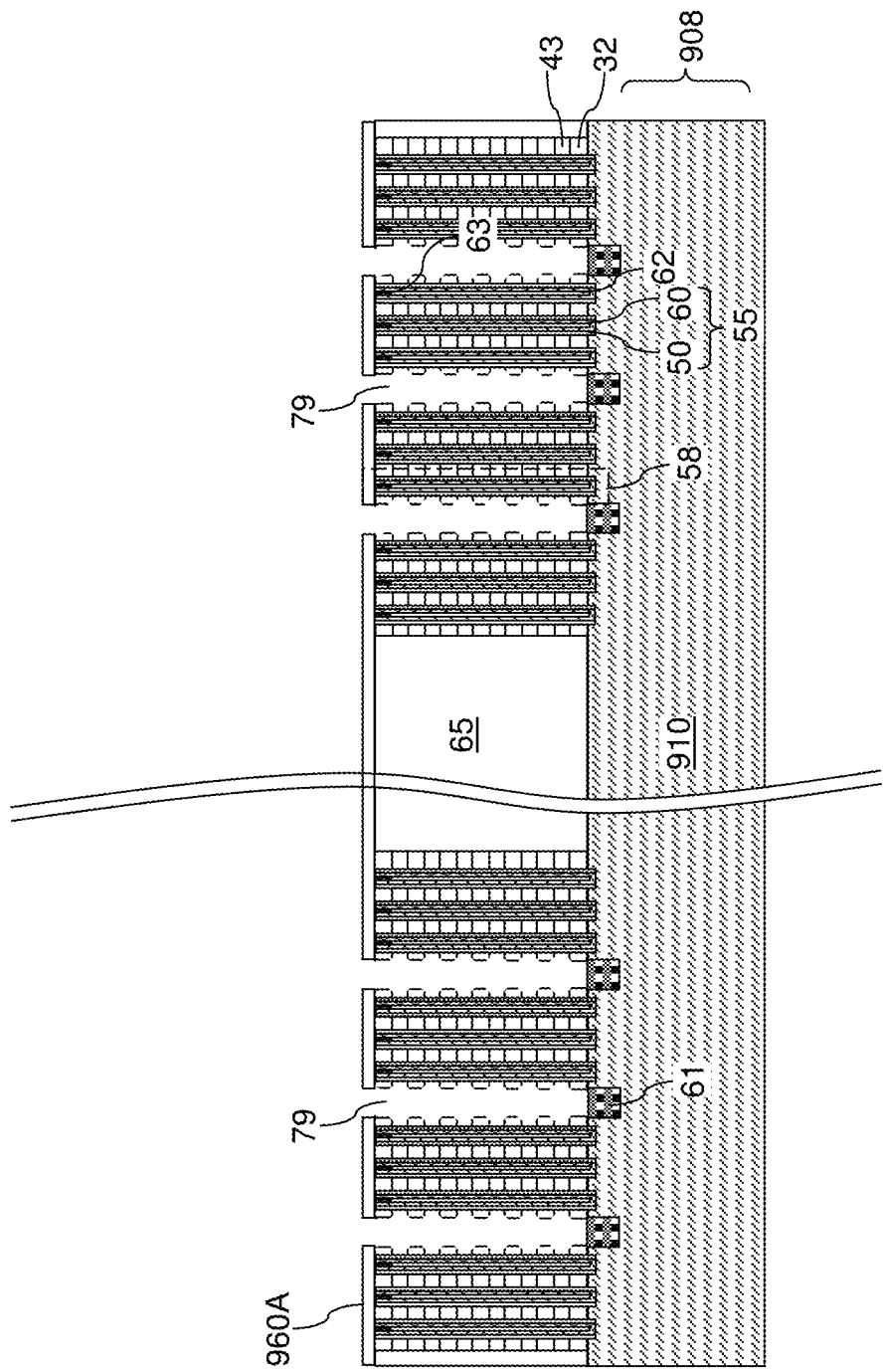
FIG. 14B is a second vertical cross-sectional view of a second portion of the exemplary memory die at the processing step of FIG. 14A.

Referring to FIGS. 14A and 14B, the sacrificial material layers 42 can be removed selective to the insulating layers 32 and the memory opening fill structures 58. Backside recesses 43 are formed in volumes from which the sacrificial material layers 42 are removed.

Figure 15A:
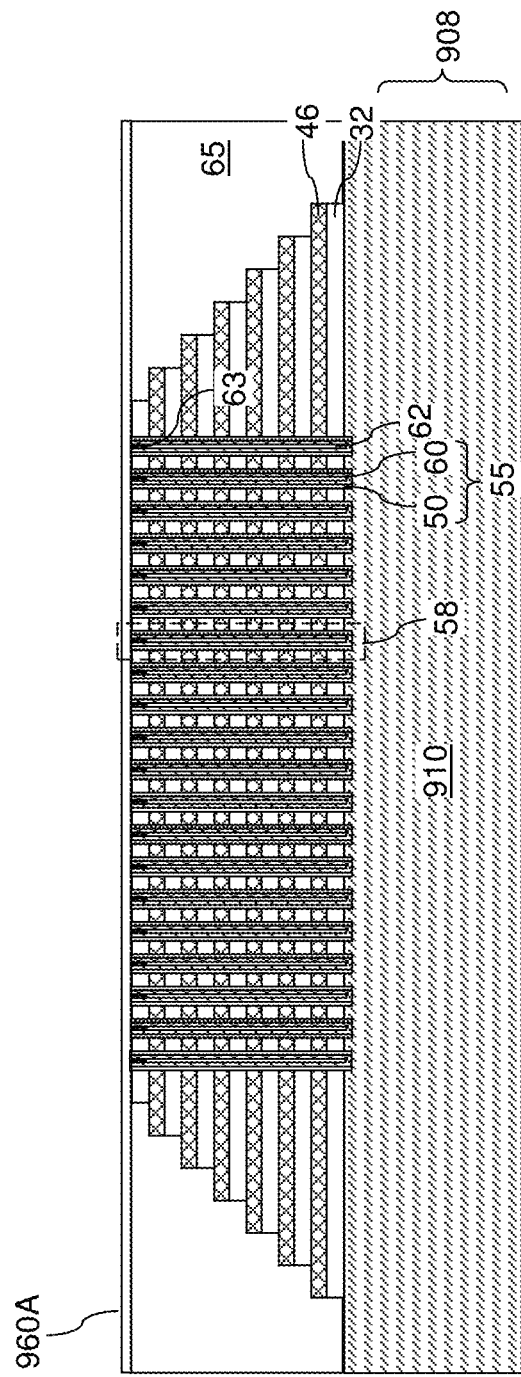
FIG. 15A is a first vertical cross-sectional view of a first portion of the exemplary memory die after formation of electrically conductive layers according to an embodiment of the present disclosure.
Figure 15B:
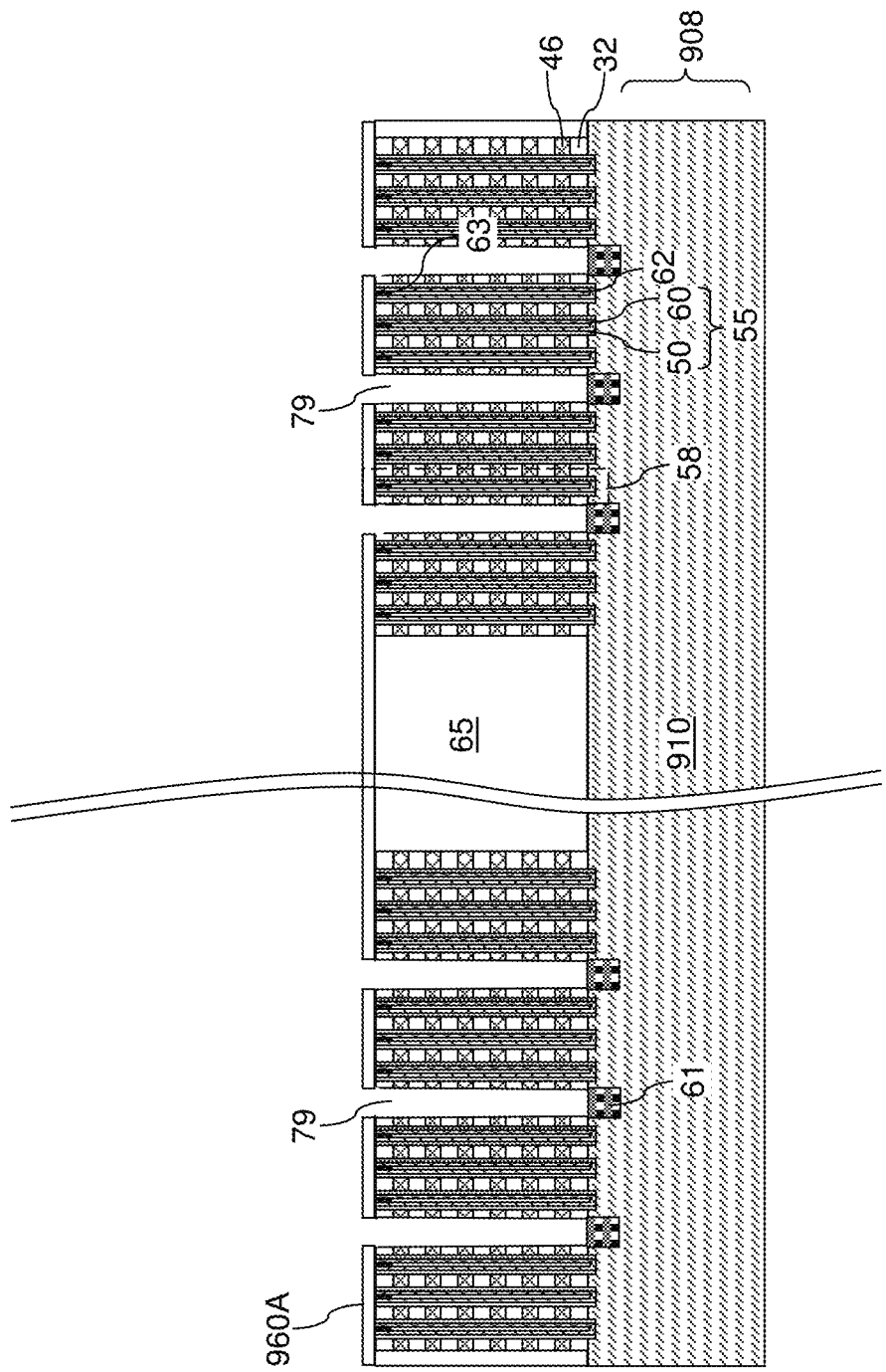
FIG. 15B is a second vertical cross-sectional view of a second portion of the exemplary memory die at the processing step of FIG. 15A.

Referring to FIGS. 15A and 15B, the electrically conductive layers 46 can be formed by depositing at least one electrically conductive material in the backside recesses 43 and removing excess portions of the electrically conductive material from inside the backside trenches 79 and from above the alternating stacks (32, 46).

Figure 16A:
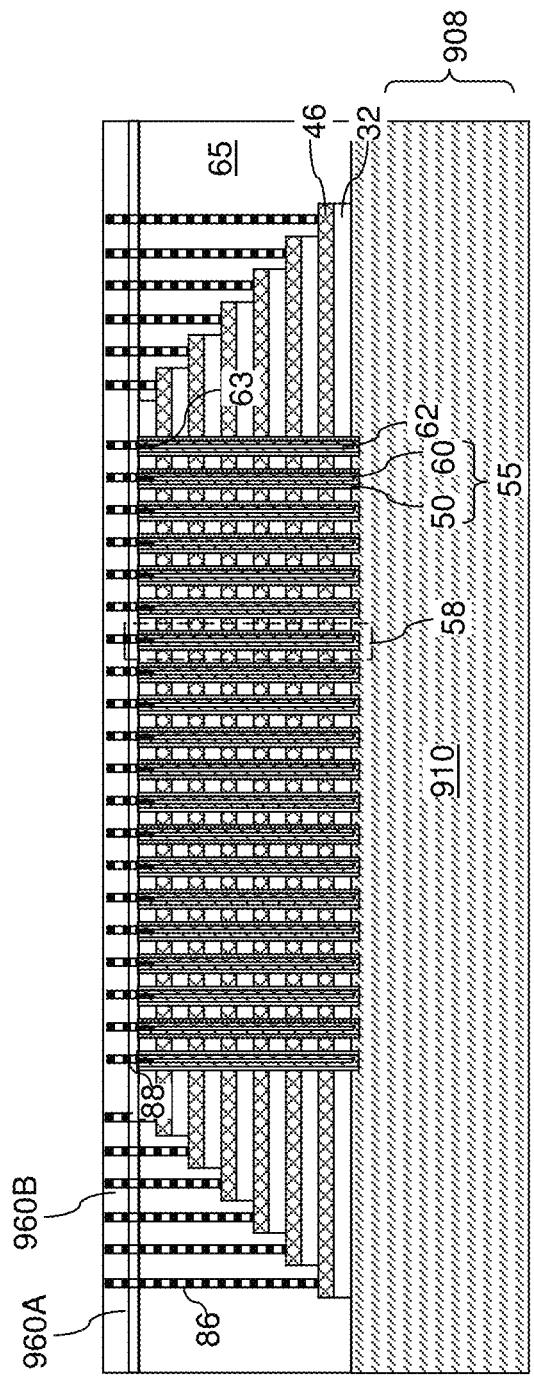
FIG. 16A is a first vertical cross-sectional view of a first portion of the exemplary memory die after formation of contact via structures according to an embodiment of the present disclosure.
Figure 16B:
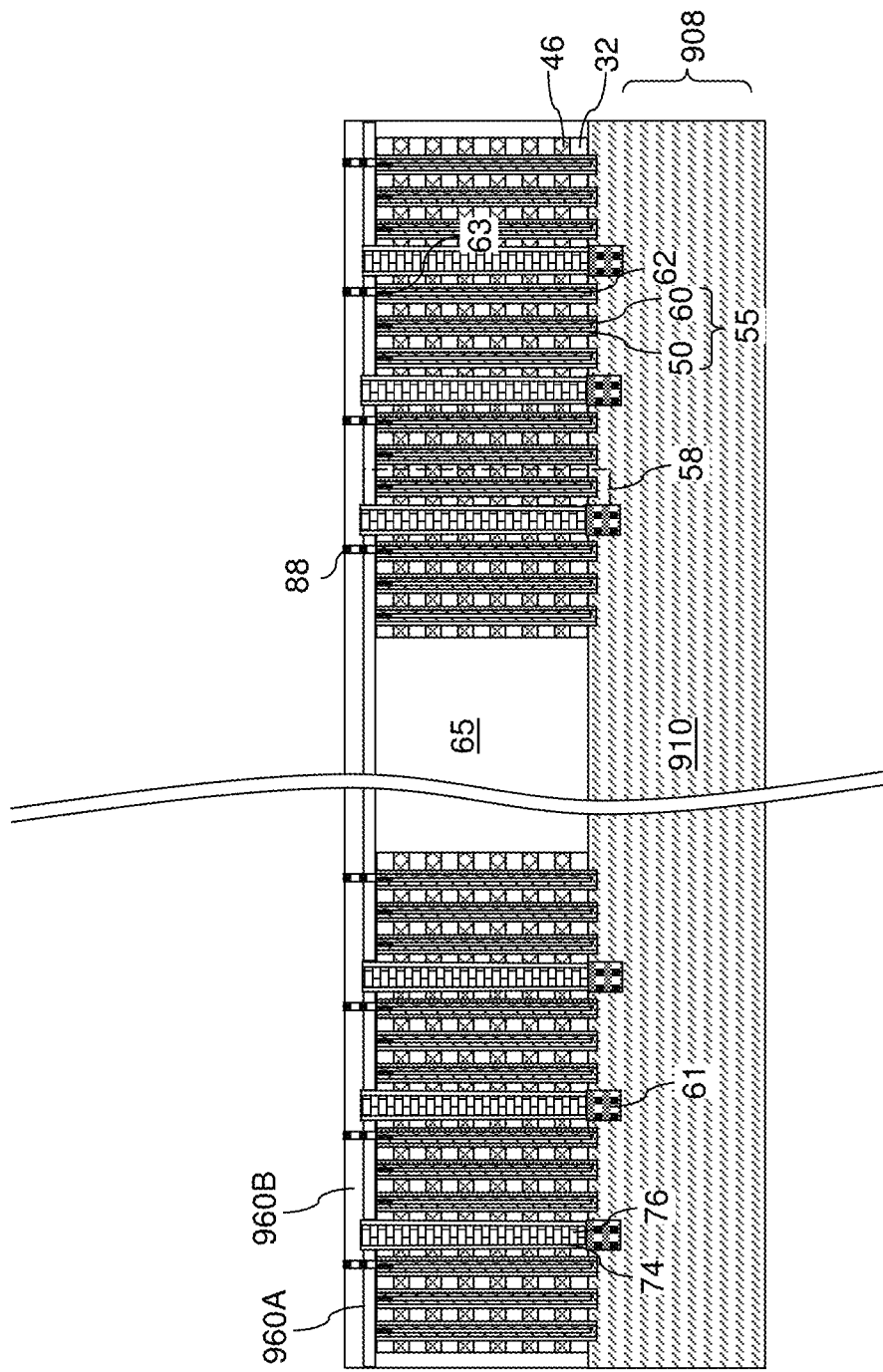
FIG. 16B is a second vertical cross-sectional view of a second portion of the exemplary memory die at the processing step of FIG. 16A.

Referring to FIGS. 16A and 16B, each backside trench 79 can be filled with a respective backside trench fill structure, which may include, for example, an insulating spacer 74 and a backside contact via structure 76 that can function as a source contact via structure. A contact-level dielectric layer 960B can be deposited over the insulating cap layer 960A. Drain contact via structures 88 can be formed on the drain regions 63, and layer contact via structures 86 can be formed on the electrically conductive layers 46.

Subsequently, memory-side dielectric material layers 960 embedding memory-side metal interconnect structures 980 may be formed to provide a memory die 900 of the first exemplary structure, or upper-level dielectric material layers 460 embedding upper-level metal interconnect structures 480 may be formed to provide the semiconductor die of the second exemplary structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
   at least one set of vertical field effect transistors, wherein each vertical field effect transistor within each set of vertical field effect transistors comprises a bottom electrode, a vertical transistor channel, a gate dielectric which surrounds the vertical transistor channel, and a top electrode; and
   a three-dimensional NAND memory array located over the at least one set of vertical field effect transistors, wherein electrical nodes of the three-dimensional NAND memory array are electrically connected to a respective one of the at least one set of vertical field effect transistors.

2. The semiconductor structure of claim 1, wherein the three-dimensional NAND memory array comprises:
   an alternating stack of insulating layers and electrically conductive layers;
   memory openings vertically extending through the alternating stack; and memory opening fill structures located within the memory openings and comprising a respective set of a memory film and a vertical semiconductor channel.

3. The semiconductor structure of claim 2, wherein the vertical transistor channel within each vertical field effect transistor within each set of vertical field effect transistors comprises a metal oxide semiconductor material.

4. The semiconductor structure of claim 3, wherein:
the vertical transistor channel comprises indium gallium zinc oxide;
the bottom electrode comprises a metal, metal nitride or a doped semiconductor material; and
the top electrode comprises a metal, metal nitride or a doped semiconductor material.

5. The semiconductor structure of claim 3, wherein:
the bottom electrode comprises n-type indium gallium zinc oxide; and
the top electrode comprises n-type indium gallium zinc oxide.

6. The semiconductor structure of claim 3, wherein:
the at least one set of vertical field effect transistors is located in a logic die;
the three-dimensional NAND memory array is located in a memory die which is bonded to the logic die; and
the electrical nodes of the three-dimensional NAND memory array are electrically connected to the respective one of the at least one set of vertical field effect transistors through sets of metal bonding pads through which the memory die and the logic die are bonded to each other.

7. The semiconductor structure of claim 6, wherein:
the logic die comprises substrate field effect transistors including a respective semiconductor channel comprising a portion of, or comprising a same material as, a logic-side substrate in the logic die; and
the bottom electrodes of the at least one set of vertical field effect transistors are electrically connected to a first subset of the substrate field effect transistors via a first subset of lower logic-side metal interconnect structures embedded within lower logic-side dielectric material layers.

8. The semiconductor structure of claim 7, further comprising upper logic-side metal interconnect structures electrically connecting the top electrodes of the at least one set of vertical field effect transistors to logic-side bonding pads within the sets of metal bonding pads, and embedded within upper logic-side dielectric material layers.

9. The semiconductor structure of claim 7, wherein each set of vertical field effect transistors comprises a respective gate electrode that is electrically connected to a second subset of the substrate field effect transistors via a second subset of lower logic-side metal interconnect structures.

10. The semiconductor structure of claim 3, wherein the at least one set of vertical field effect transistors are located above, and vertically spaced from, a semiconductor substrate.

11. The semiconductor structure of claim 10, further comprising:
a semiconductor material layer located between the alternating stack and the at least one set of vertical field effect transistors and comprising at least one of a horizontal semiconductor channel and a source region;
metal interconnect structures electrically connecting the electrical nodes of the three-dimensional NAND memory array to the respective one of the at least one set of vertical field effect transistors;
drain regions located within the memory opening fill structures and contacting an end portion of a respective one of the vertical semiconductor channels;
bit lines electrically connected to a respective subset of the drain regions through a respective set of drain contact via structures; and
upper-electrode-connection metal lines located between the alternating stack and the at least one set of vertical field effect transistors.

12. The semiconductor structure of claim 11, wherein:
the three-dimensional NAND memory array comprises a three-dimensional NAND array of memory elements that includes portions of the memory films that are located adjacent to a respective one of vertical semiconductor channels;
the metal interconnect structures comprise:
lower-level metal interconnect structures underlying the alternating stack;
upper-level metal interconnect structures overlying the alternating stack; and
memory-level connection via structures vertically extending between a horizontal plane including a top surface of the alternating stack and a horizontal plane including a bottom surface of the alternating stack and connecting the lower-level metal interconnect structures to the upper-level metal interconnect structures;
a subset of the top electrodes of the at least one set of vertical field effect transistors is electrically connected to a respective one of the bit lines;
the at least one set of vertical field effect transistors comprises:
a first set of vertical field effect transistors including a respective bottom electrode that is electrically connected to a respective sense amplifier circuit located on the semiconductor substrate; and
a second set of vertical field effect transistors including a respective bottom electrode that is electrically connected to a bit line bias circuit located on the semiconductor substrate; and
each of the upper-electrode-connection metal lines is electrically connected to a respective set of a top electrode within the first set of vertical field effect transistors and a top electrode within the second set of vertical field effect transistors.

13. The semiconductor structure of claim 11, wherein:
at least 50% of a total area of the at least one set of vertical field effect transistors has an areal overlap with a total area including each sense amplifier circuit and each bit line bias circuit in a plan view;
the electrically conductive layers comprise word lines of the three-dimensional NAND memory array;
layer contact via structures extend vertically through a dielectric material portion and contact a surface of a respective one of the electrically conductive layers;
a subset of the top electrodes of the at least one set of vertical field effect transistors is electrically connected to a respective one of the word lines; and
each set of vertical field effect transistors comprises a respective gate electrode that laterally surrounds each of the gate dielectrics within a same set of vertical field effect transistors.

14. The semiconductor structure of claim 13, further comprising substrate field effect transistors including a respective semiconductor channel comprising a portion of, or comprising a same material as, the semiconductor substrate, wherein the bottom electrodes of the at least one set of vertical field effect transistors are electrically connected to a first subset of the substrate field effect transistors via a first subset of first metal interconnect structures embedded within first dielectric material layers that underlie the at least one set of vertical field effect transistors; and wherein the gate electrode of each set of vertical field effect transistors is electrically connected to a second subset of the substrate field effect transistors via a second subset of the first metal interconnect structures.

15. A method of forming a semiconductor structure, comprising:

forming at least one set of vertical field effect transistors, wherein each vertical field effect transistor within each set of vertical field effect transistors comprises a bottom electrode, a vertical transistor channel, a gate dielectric which surrounds the vertical transistor channel, and a top electrode; and forming a three-dimensional NAND memory array located over the at least one set of vertical field effect transistors, wherein electrical nodes of the three-dimensional NAND memory array are electrically connected to a respective one of the at least one set of vertical field effect transistors.

16. The method of claim 15, wherein the vertical transistor channel comprises a metal oxide semiconductor material.

17. The method of claim 16, wherein:

the vertical transistor channel comprises indium gallium zinc oxide;

the bottom electrode comprises a metal, metal nitride or a doped semiconductor material; and the top electrode comprises a metal, metal nitride or a doped semiconductor material.

18. The method of claim 17, wherein:

the bottom electrode comprises n-type indium gallium zinc oxide formed by exposing indium gallium zinc oxide to at least one of argon or nitrogen containing plasma, by ion implanting at least one of argon or nitrogen into the indium gallium zinc oxide, or by in-situ doping the indium gallium zinc oxide with at least one of argon or nitrogen; and the top electrode comprises n-type indium gallium zinc oxide formed by exposing indium gallium zinc oxide to at least one of argon or nitrogen containing plasma, by ion implanting at least one of argon or nitrogen into the indium gallium zinc oxide, or by in-situ doping the indium gallium zinc oxide with at least one of argon or nitrogen.

19. The method of claim 17, wherein:

the indium gallium zinc oxide is deposited by at least one of physical vapor deposition, chemical vapor deposition or atomic layer deposition;

an oxygen partial pressure during deposition of the indium gallium zinc oxide is between 1 Pa and 3 Pa; and the indium gallium zinc oxide is subjected to at least one of a $N_2O$ plasma treatment or an anneal at 550 K to 650 K for 45 to 90 minutes.

20. The method of claim 16, wherein:

the at least one set of vertical field effect transistors is located in a logic die;

the three-dimensional NAND memory array is located in a memory die; and the method further comprises bonding the memory die to the logic die.

* * * * *